US012581873B2

(12) United States Patent
Kaneko et al.

(10) Patent No.: US 12,581,873 B2
(45) **Date of Patent: *Mar. 17, 2026**

(54) METHOD OF MANUFACTURING SIC SEMICONDUCTOR DEVICE AND SIC SEMICONDUCTOR DEVICE

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Sanda (JP); Kiyoshi Kojima, Tokyo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 857 days.

This patent is subject to a terminal disclaimer.

(21) Appl. No.: 17/761,176

(22) PCT Filed: Sep. 24, 2020

(86) PCT No.: PCT/JP2020/036001
§ 371 (c)(1),
(2) Date: Mar. 16, 2022

(87) PCT Pub. No.: WO2021/060366
PCT Pub. Date: Apr. 1, 2021

(65) Prior Publication Data
US 2022/0375749 A1 Nov. 24, 2022

(30) Foreign Application Priority Data
Sep. 27, 2019 (JP) ................................. 2019-178072

(51) Int. Cl.
*H01L 21/02* (2006.01)
*H10D 62/832* (2025.01)
*C30B 29/36* (2006.01)

(52) U.S. Cl.
CPC .. *H01L 21/02378* (2013.01); *H01L 21/02529* (2013.01); *H01L 21/0262* (2013.01); *H10D 62/8325* (2025.01); *C30B 29/36* (2013.01)

(58) Field of Classification Search
CPC ......... H01L 21/02378; H01L 21/02529; H01L 21/0262; H01L 21/76254; H10D 62/8325; C30B 29/36
See application file for complete search history.

(56) References Cited

U.S. PATENT DOCUMENTS

2006/0243984 A1* 11/2006 Gupta ..................... C30B 29/36
257/77
2007/0224784 A1* 9/2007 Soloviev ........... H01L 21/02378
257/E21.132

(Continued)

FOREIGN PATENT DOCUMENTS

CN 109234804 A 1/2019
JP 2011-219298 A 11/2011

(Continued)

OTHER PUBLICATIONS

English Translation of Office Action from Chinese Application No. 202080065954.4 dated Sep. 15, 2023 (21 pages).

(Continued)

*Primary Examiner* — Jessica S Manno
*Assistant Examiner* — Andrew Chung
(74) *Attorney, Agent, or Firm* — Calfee, Halter & Griswold LLP

(57) ABSTRACT

An object of the present invention is to provide a high-quality SiC semiconductor device. In order to solve the (Continued)

above problem, the present invention comprises a method for producing a SiC semiconductor device, comprising a growth step of forming a growth layer on a workpiece comprising SiC single crystals, a device formation step of forming at least a portion of a SiC semiconductor device in the growth layer, and a separation step of separating at least a portion of the SiC semiconductor device from the workpiece.

14 Claims, 12 Drawing Sheets

(56) References Cited

U.S. PATENT DOCUMENTS

| | | | | |
|---|---|---|---|---|
| 2014/0038392 A1* | 2/2014 | Yonehara | ............. | B81C 1/0038 |
| | | | | 438/463 |
| 2014/0252373 A1 | 9/2014 | Mauder et al. | | |
| 2014/0353684 A1* | 12/2014 | Kim | ................. | H01L 21/02529 |
| | | | | 117/88 |
| 2016/0307792 A1 | 10/2016 | Wolfgang et al. | | |
| 2019/0136409 A1* | 5/2019 | Kaneko | ............ | H01L 21/02378 |

FOREIGN PATENT DOCUMENTS

| | | | | | |
|---|---|---|---|---|---|
| JP | 2013-189323 | A | 9/2013 | | |
| JP | 2014-179605 | A | 9/2014 | | |
| JP | 2015-24932 | A | 2/2015 | | |
| WO | WO-2017188381 | A1 * | 11/2017 | ............ | C30B 23/02 |
| WO | 2019/044029 | A1 | 3/2019 | | |

OTHER PUBLICATIONS

EPO Communication and European Search Report issued in EP application No. 20869992.6 dated Oct. 5, 2023 (8 pages).
English Translation of Office Action from Chinese Application No. 202080065954.4 dated Jan. 27, 2024 (8 pages).
English Translation of International Search Report from PCT/JP2020/036001 dated Dec. 8, 2020 (2 pages).

* cited by examiner

BEST AVAILABLE IMAGE

INSULATING FILM
FORMATION STEP (S23)

ELECTRODE FORMATION STEP
(S24)

(a)

(b)

(a)

(b)

(c)

(d)

(a)

(b)

(a)

(b)

METHOD OF MANUFACTURING SIC SEMICONDUCTOR DEVICE AND SIC SEMICONDUCTOR DEVICE

CROSS-REFERENCE TO RELATED APPLICATIONS

This application is a 371 of PCT Application No. PCT/JP2020/036001, filed on Sep. 24, 2020, which claims priority to Japanese Application No. 2019-178072, filed on Sep. 27, 2019, the contents of which are hereby incorporated by reference as if recited in their entirety.

TECHNICAL FIELD

The present invention relates to a method for producing a SiC semiconductor device and a SiC semiconductor device.

BACKGROUND ART

Silicon carbide (SiC) has superior physical properties to silicon (Si), in terms of dielectric breakdown strength, thermal conductivity, radiation resistance and the like, and is being researched and developed as a material for electronic devices.

The quality of SiC semiconductor devices is affected by the warpage caused by the internal stress of SiC single crystal wafers. The warpage may, for example, make patterning on SiC single crystal wafers difficult. In addition, the warpage is a major factor that inhibits device production by causing SiC single crystal wafer adsorption errors, machine stoppage due to the warpage, SiC single crystal wafer cracking, and the like.

Therefore, SiC wafers having a substrate thickness larger than required are sometimes used in the production of SiC semiconductor devices, and there is room for improvement in the economy of this process.

Patent Literature 1 discloses an invention for a method for producing a SiC substrate having an epitaxial layer one by one, including growing an epitaxial layer on a seed crystal substrate and growing a SiC substrate, and further including removing the obtained SiC substrate having an epitaxial layer from the seed crystal substrate.

CITATION LIST

Patent Literature

Patent Literature 1: JP 2015-24932 A

SUMMARY OF INVENTION

Technical Problem

However, according to the description in Patent Literature 1, since the obtained SiC substrate having the epitaxial layer is sent to the subsequent element production process, it is difficult to say that the effect of the warpage on the production process of a SiC semiconductor device can be eliminated.

In view of the above circumstances, an object of the present invention is to provide a high-quality SiC semiconductor device.

Solution to Problem

In order to solve the above problem, the present invention includes a growth step of forming a growth layer on a containing SiC single crystals, a device formation step of forming at least a portion of a SiC semiconductor device in the growth layer, and a separation step of separating at least a portion of the SiC semiconductor device from the workpiece. With this configuration, the present invention makes it possible to form at least a portion of a SiC semiconductor device on a SiC wafer with suppressed wafer warpage and then separate the SiC wafer containing the portion, thus realizing the production of SiC semiconductor devices having excellent economic efficiency while suppressing the effects of wafer warpage on the SiC process.

In a preferred mode of the present invention, in the growth step, the workpiece is heat-treated in an atmosphere containing Si and C elements. With this configuration, a SiC wafer of high quality can be produced and a SiC semiconductor device can be produced while eliminating or suppressing the occurrence of strain, crystal defects, basal plane dislocation (BPD), and macro-step bunching (MSB).

In a preferred mode of the present invention, the growth step includes heat-treating the workpiece in a semi-closed space where a SiC material is exposed. With this configuration, the present invention allows to produce a high-quality SiC wafer while eliminating or suppressing the occurrence of strains, crystal defects, BPDs, and MSBs, and to produce a SiC semiconductor device.

In a preferred mode of the present invention, the device formation step includes a patterning step of forming a circuit pattern on the workpiece. With this configuration, the present invention allows to perform patterning suitably on a SiC wafer with suppressed wafer warpage and to produce a high-quality SiC semiconductor device.

In a preferred mode of the present invention, the device formation step includes a doping step of introducing dopant atoms into the workpiece. With this configuration, the present invention allows to perform doping suitably on a SiC wafer with suppressed wafer warpage and to produce a high-quality SiC semiconductor device.

In a preferred mode of the present invention, the device formation step includes an insulating film formation step of introducing an insulating film to the workpiece. With this configuration, the present invention allows to form an insulating film suitably on a SiC wafer with suppressed wafer warpage and to produce a high-quality SiC semiconductor device.

In a preferred mode of the present invention, the device formation step includes an electrode formation step of forming an electrode on the workpiece. With this configuration, the present invention allows to perform electrode formation suitably on a SiC wafer with suppressed wafer warpage and to produce a high-quality SiC semiconductor device.

In a preferred mode of the present invention, the separation step includes a separation layer formation step of forming a separation layer inside the workpiece, and a peeling step of peeling off a portion of the workpiece starting from the separation layer. With this configuration, the present invention can achieve the separation of the SiC wafer containing at least a portion of a SiC semiconductor device while minimizing material loss.

In a preferred mode of the present invention, the separation layer formation step includes forming the separation layer by irradiating laser onto the workpiece so that the inside becomes the focal point. With this configuration, the present invention allows to form a planarized separation layer in SiC single crystals, which is the starting point for peeling.

In a preferred mode of the present invention, an etching step of heat-treating the workpiece in an atmosphere containing Si and C elements to etch the workpiece, is performed.

With this configuration, the present invention allows to produce a high-quality SiC wafer while eliminating or suppressing the occurrence of strains, crystal defects, BPDs, and MSBs, and to produce a SiC semiconductor device.

In a preferred mode of the present invention, the etching step includes heat-treating the workpiece in a semi-closed space where a SiC material is exposed. With this configuration, the present invention allows to produce a high-quality SiC wafer while eliminating or suppressing the occurrence of strains, crystal defects, BPDs, and MSBs, and to produce a SiC semiconductor device.

A preferred mode of the present invention includes the separation step, the etching step, and the growth step in this order. With this configuration, the present invention allows the repeated production of SiC wafers of higher quality, which include at least a portion of a SiC semiconductor device, thus realizing the production of SiC semiconductor devices with excellent economic efficiency.

A preferred mode of the present invention includes the separation step and the growth step in this order. With this configuration, the present invention allows the repeated production of high-quality SiC wafers, which include at least a portion of a SiC semiconductor device, and thus realizing the production of SiC semiconductor devices with excellent economic efficiency.

In order to solve the above problems, the present invention includes a growth layer having a basal plane dislocation density of <100/cm², wherein the growth layer is an n type or p type substrate. With this configuration, the present invention can realize a high quality SiC semiconductor device in which the formation of stacking faults, which is a factor in the degradation of forward characteristics, is suppressed.

In a preferred mode of the present invention, the dopant concentration in the growth layer is $1.0 \times 10^{17}/cm^3$ or more. With this configuration, the present invention can realize a high-quality SiC semiconductor device in which, for example, the occurrence of stacking faults, which is a factor in the degradation of forward characteristics, is suppressed.

Advantageous Effects of Invention

According to the present invention, a high-quality SiC semiconductor device can be provided.

Other problems, features, and advantages will become apparent by reading the embodiments for implementing the present invention described below, when taken up together with the drawings and claims.

4

Figure 8:
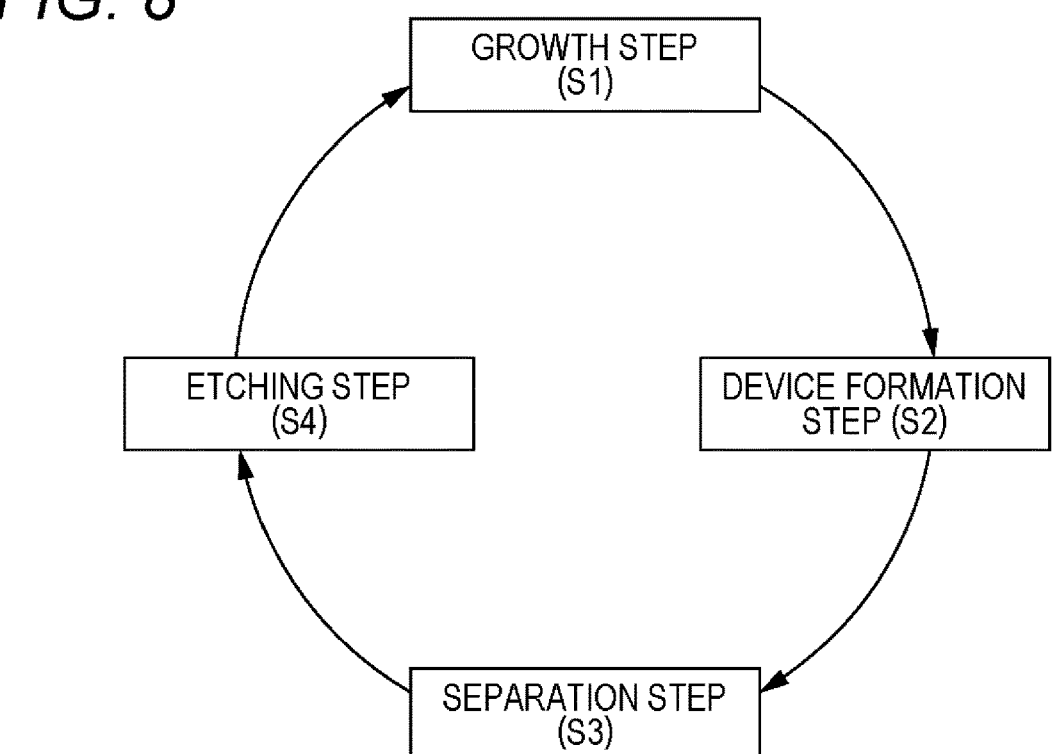

FIG. 8 schematically illustrates the production process of a SiC semiconductor device.

Figure 9:
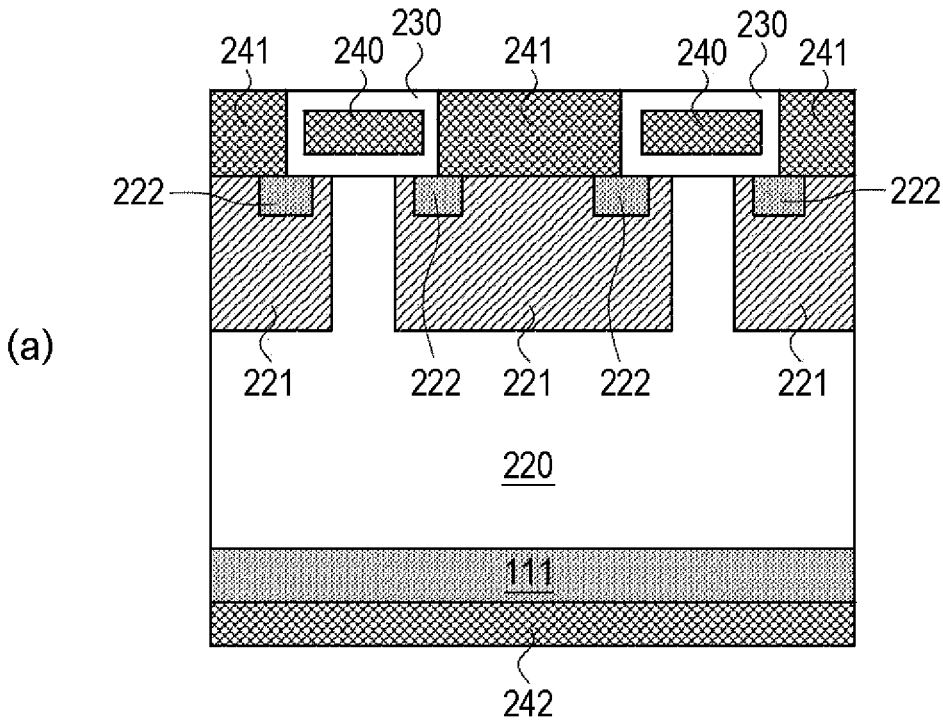
Figure 9:
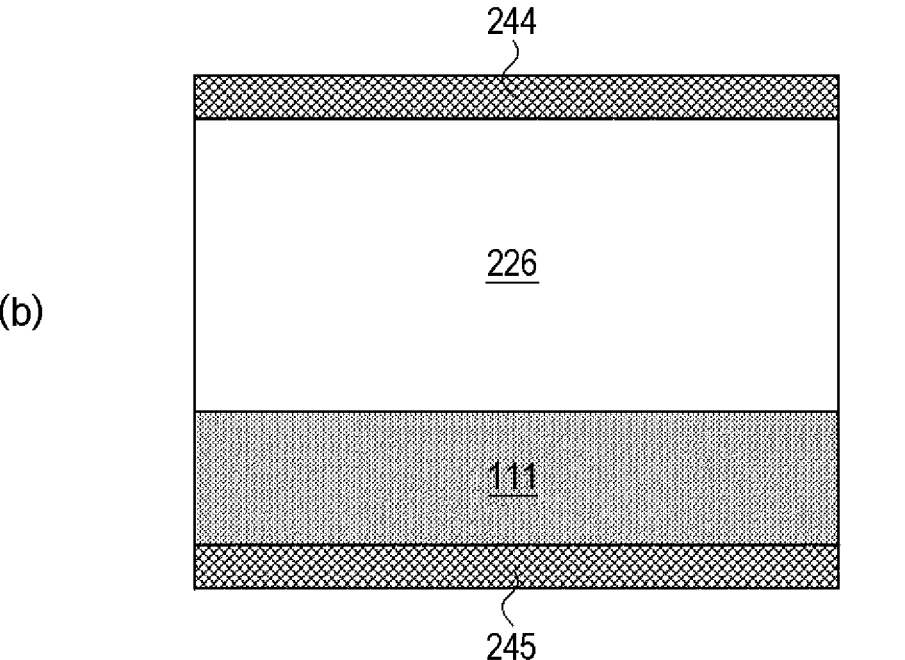

FIG. 9 schematically illustrates a SiC semiconductor device.

Figure 10:
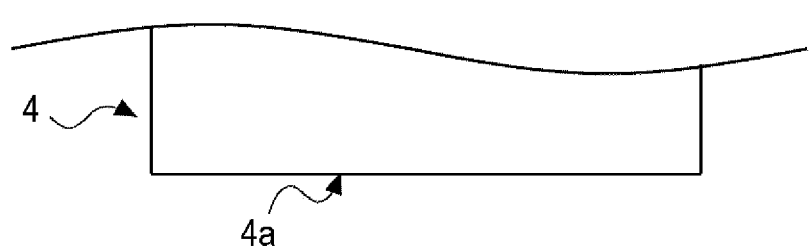
Figure 10:
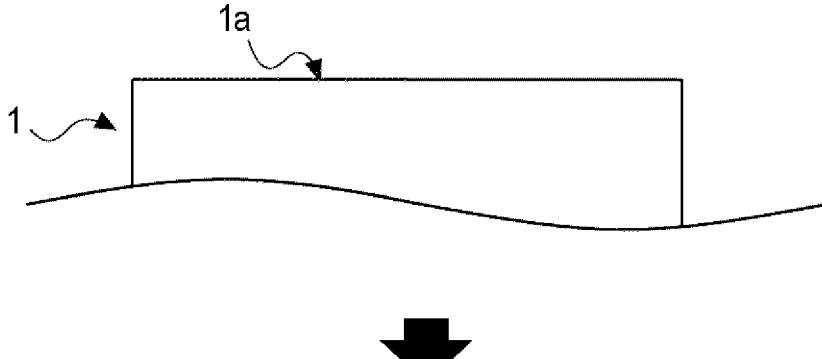
Figure 10:
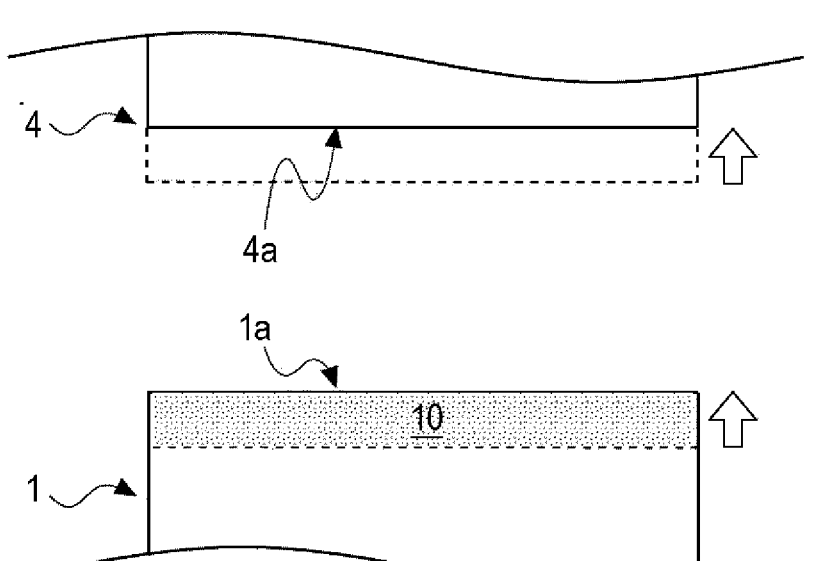

FIG. 10 schematically illustrates raw material transport in the growth step and the etching step.

Figures 11, 12:
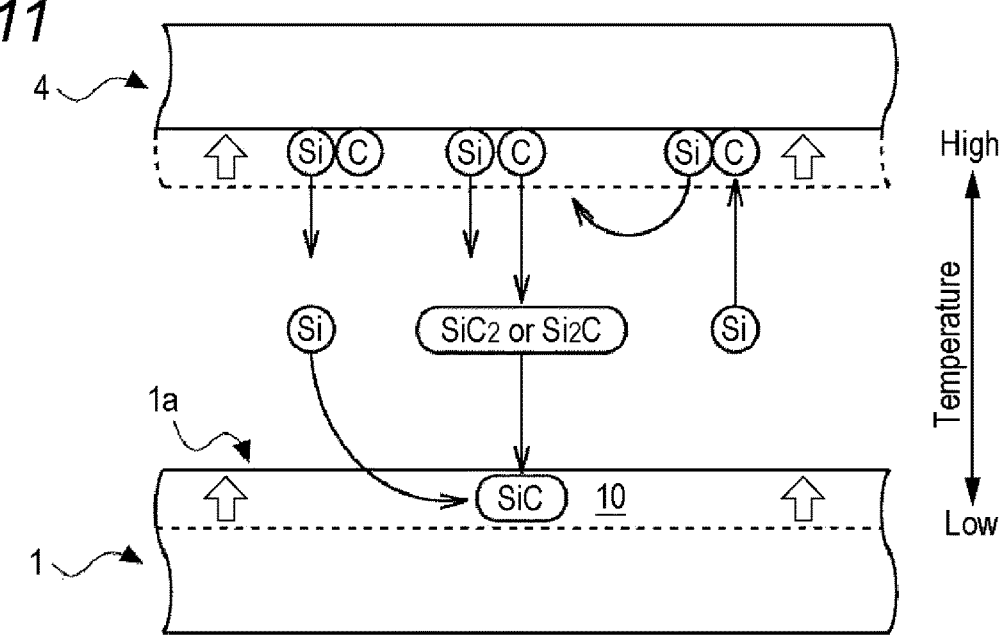

FIG. 11 schematically illustrates raw material transport in the growth step and the etching step.

FIG. 12 schematically illustrates a main body container and a high-melting point container.

Figure 13:
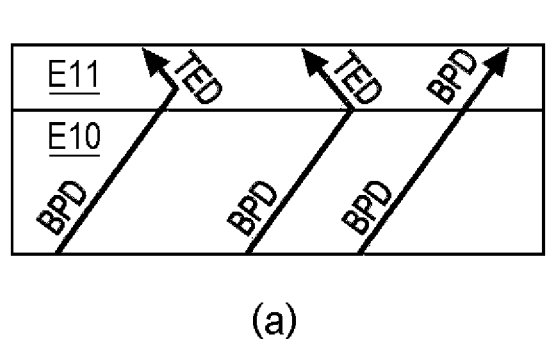
Figure 13:
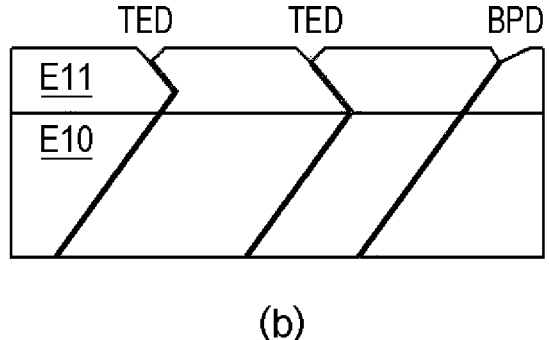
Figure 13:
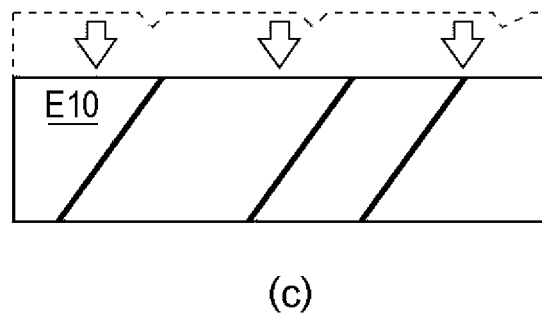
Figure 13:
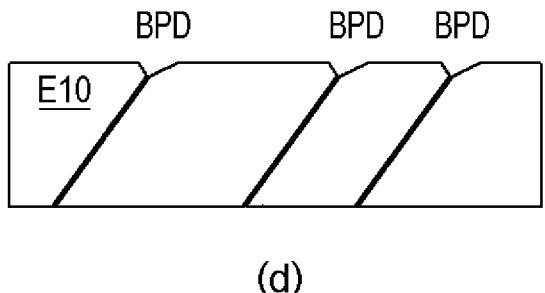

FIG. 13 illustrates a method for determining the BPD conversion rate.

Figure 14:
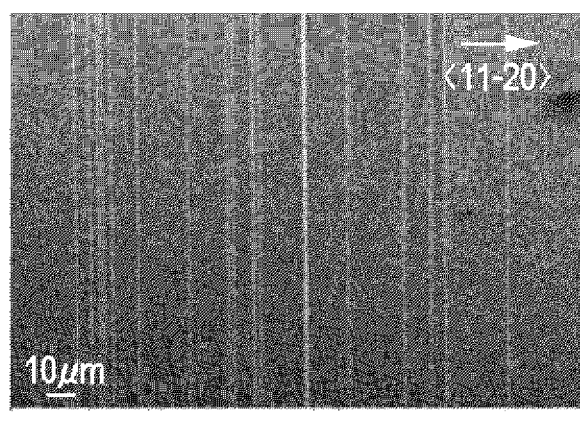
Figure 14:
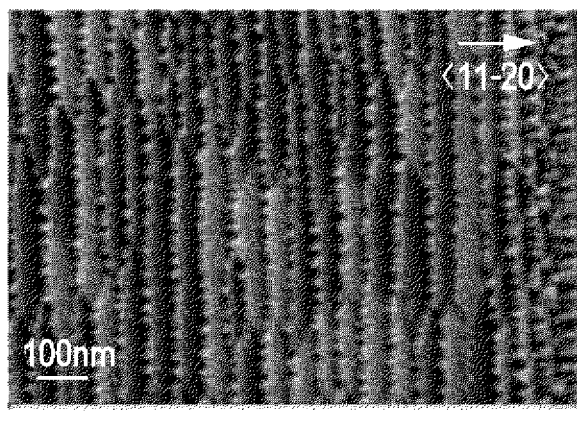

FIG. 14 illustrates a SiC wafer formed in the heat treatment step.

Figure 15:
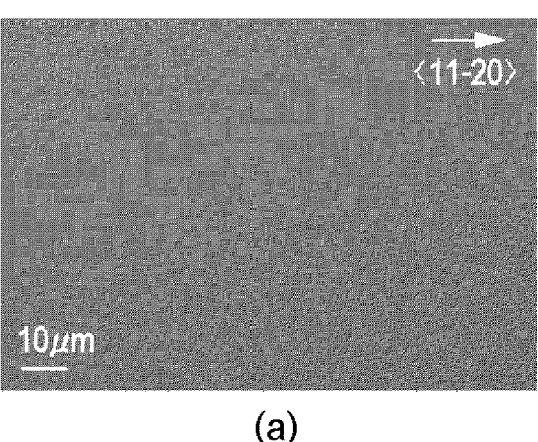
Figure 15:
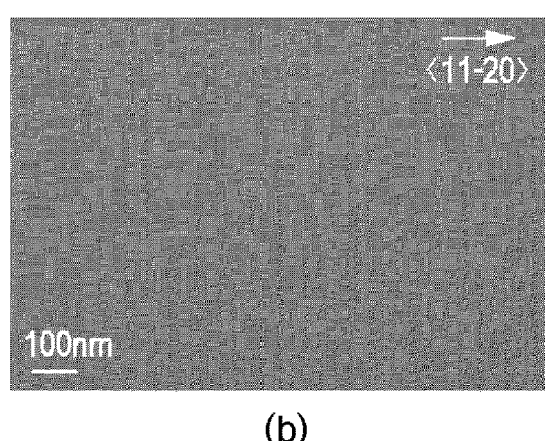

FIG. 15 illustrates a SiC wafer formed in the heat treatment step.

Figure 16:
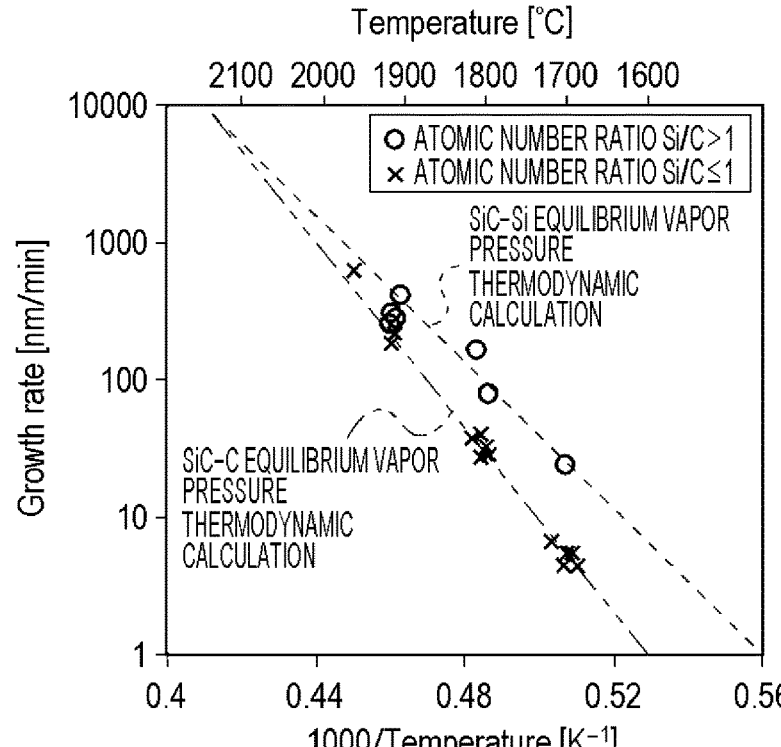

FIG. 16 is an Arrhenius plot for the heat treatment step.

DESCRIPTION OF EMBODIMENTS

A preferred embodiment of the present invention will be described below with reference to drawings. Some of the reference signs described below are not illustrated in the drawings.

The technical scope of the present invention is not limited to the embodiments illustrated in the accompanying drawings, and may be modified as necessary within the scope of the claims.

Figure 1:
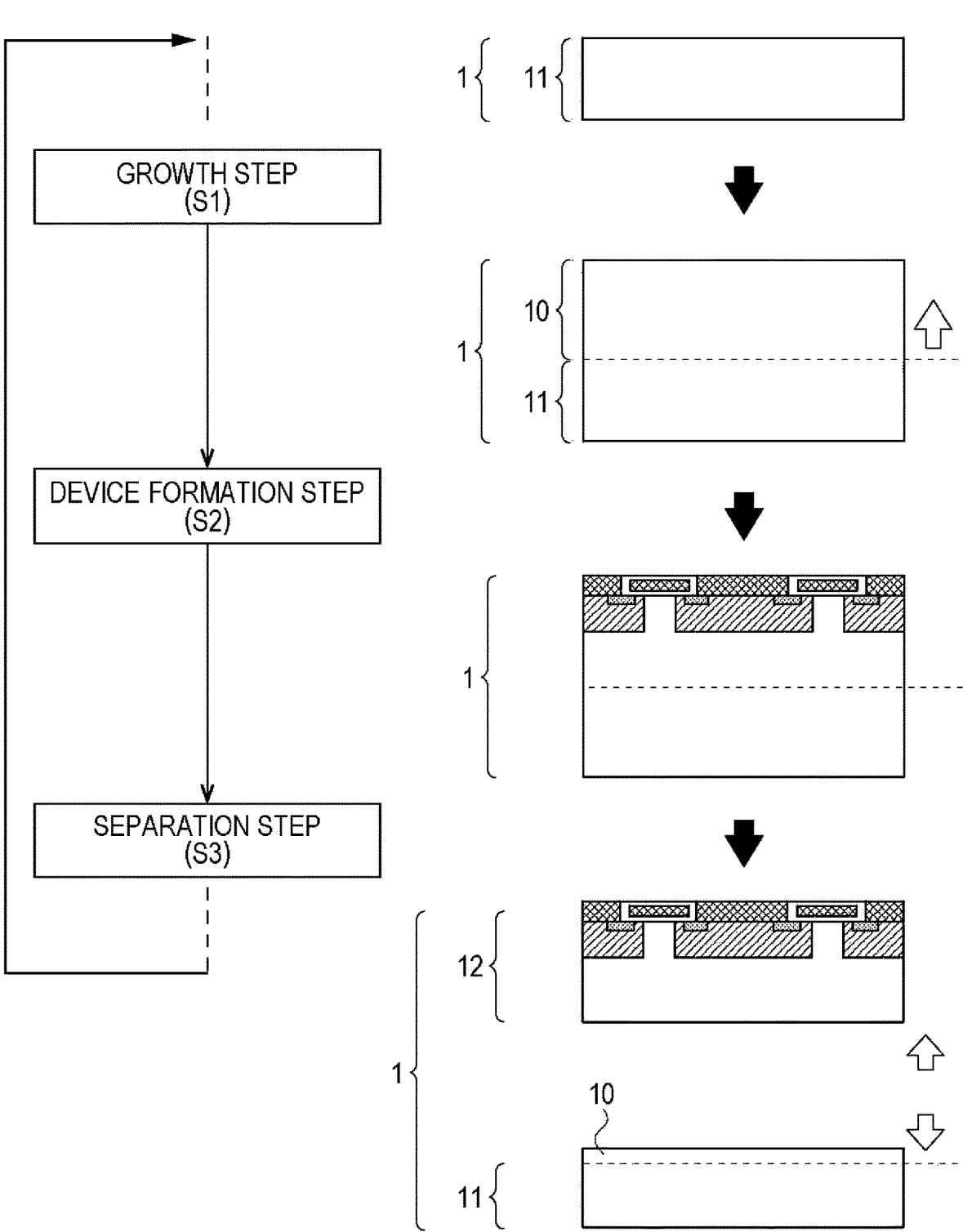
FIG. 1 schematically illustrates the production process of a SiC semiconductor device.

As illustrated in FIG. 1, an embodiment of the present invention includes a growth step S1 of forming a growth layer 10 on a workpiece 1 containing SiC single crystals, a device formation step S2 of forming at least a portion of a SiC semiconductor device 12 in the growth layer 10, and a separation step S3 of separating at least a portion of the formed SiC semiconductor device 12 from the workpiece 1.

As used herein, the term "SiC semiconductor device 12" in the description herein refers to a semiconductor device including at least a SiC material including a SiC device.

The workpiece 1 includes an base substrate 11 including SiC single crystals. The base substrate 11 may be a SiC ingot produced by a known crystal growth method such as sublimation, or a SiC wafer sliced into a disk shape from the SiC ingot. As used herein, the term "SiC single crystal polytypes" refers to known polytypes such as 3C, 4H, and 6H.

The cross-sectional size of the workpiece 1 is a few centimeters, 2 inches, 3 inches, 4 inches, 6 inches, 8 inches, or 12 inches square. There is no limit to the size of the relevant cross section.

The surface of the workpiece 1 may be configured to have an off-angle of a few degrees (for example, from 0.4 to 8.0°) from the (0001) or (000–1) plane. The "-" in the description herein refers to the bar in the Miller index notation.

The method for producing the SiC semiconductor device 12 can be understood as follows.

1) The growth step S1 includes forming the growth layer 10 on the base substrate 11.

2) The device formation step S2 includes processing the growth layer 10 to form at least a portion of the SiC semiconductor device 12.

3) The separation step S3 includes separating at least a portion of the SiC semiconductor device 12, which has been formed by the device formation step S2, from the workpiece 1.

<<Growth Step S1>>

Figure 2:
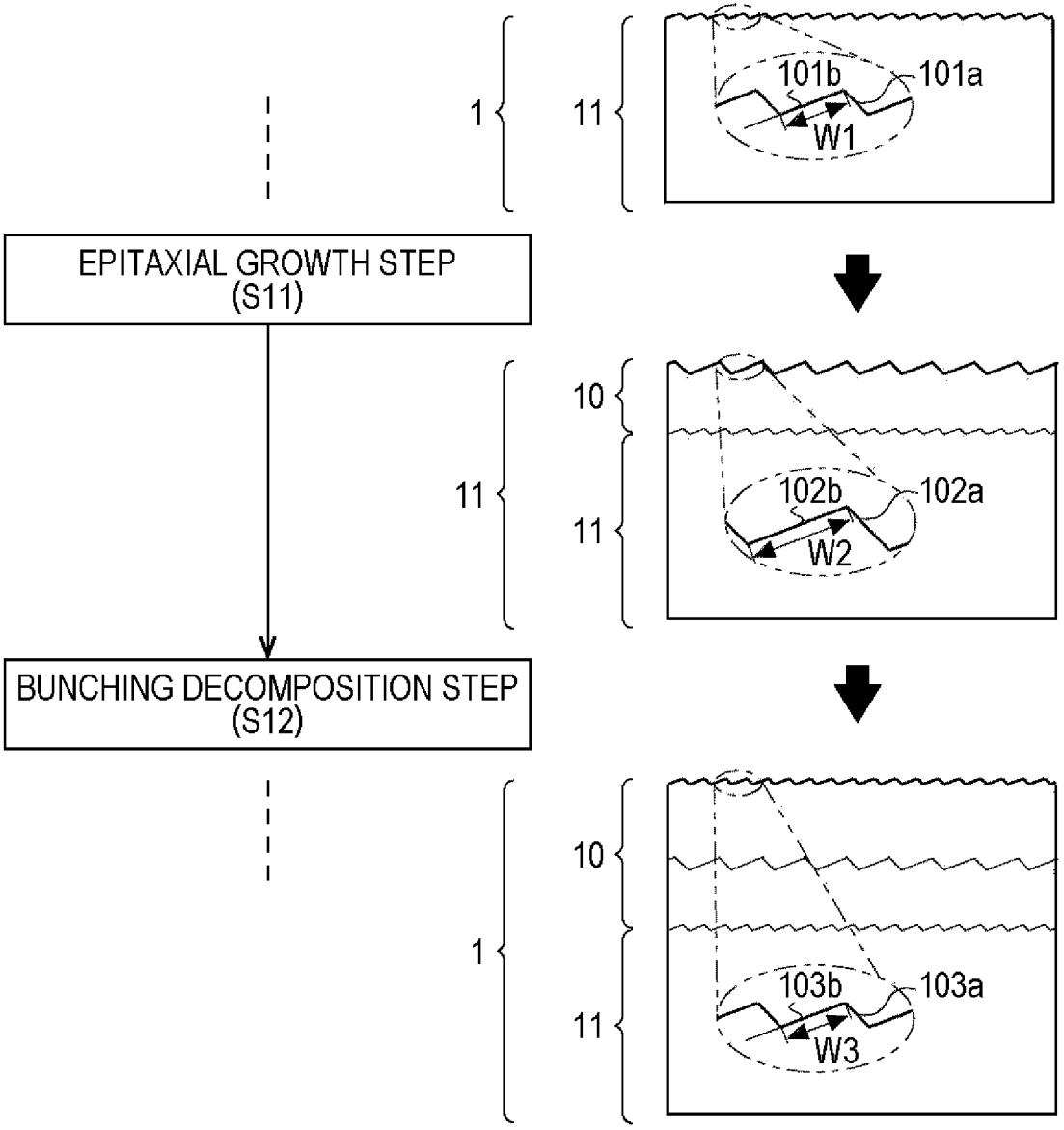
FIG. 2 schematically illustrates the growth step.

As illustrated in FIG. 2, the growth step S1 includes an epitaxial growth step S11 and a bunching decomposition step S12 to form the growth layer 10 on the base substrate 11. The mechanism for the growth step S1 will be described later herein. FIG. 2 illustrates the SiC semiconductor device 12 having a field-effect transistor (FET) structure.

The epitaxial growth step S11 includes crystal-growing to form the growth layer 10 having a step 102a and a terrace 102b having a lengthened terrace length W2, or to form the growth layer 10 having a bunched surface on the surface of the base substrate 11 having a step 101a and a terrace 101b presenting a reduced terrace length W1.

The epitaxial growth step S11 also includes crystal-growing to form a growth layer having a basal plane dislocation density (BPD density) of <100/cm², or to convert the BPDs on the workpiece 1 into other defects and dislocations including threading edge dislocation (TED) to form at least a portion of the growth layer 10.

The bunching decomposition step S12 includes decomposing the MSBs on the surface of the workpiece 1 and crystal-growing the workpiece 1 to form another growth layer 10 having a step 103a and a terrace 103b presenting a reduced terrace length W3, or to form a planarized, bunching-free surface on the surface of the growth layer 10 having the step 102a and the terrace 102b. At this time, the surface of the growth layer 10 is terminated by the step that presents the height of a full unit in the SiC single crystal.

As used herein, the term "planarized, bunching-free surface" refers to a SiC surface on which the MSBs have been decomposed.

The term "MSBs" in the description herein refers to those steps on the SiC surface that, by bunching, form a height that exceeds the full unit of each polytype.

In other words, MSBs are the steps that are bunched more than 4 molecular layers (5 or more molecular layers) for 4H—SiC and more than 6 molecular layers (7 or more molecular layers) for 6H—SiC.

The thickness of the growth layer 10 formed in an embodiment of the present invention is preferably 500 μm or less, more preferably 350 μm or less, even more preferably 200 μm or less, yet even more preferably 150 μm or less, yet even more preferably 120 μm or less, yet even more preferably 100 μm or less, yet even more preferably 50 μm or less, and yet even more preferably 20 μm or less.

The thickness is preferably 20 μm or more, more preferably 50 μm or more, even more preferably 100 μm or more, yet even more preferably 150 μm or more, yet even more preferably 200 μm or more, and yet even more preferably 350 μm or more.

The growth step S1 may further include, after forming a growth layer having a BPD density of <100/cm², performing SiC epitaxial growth based on a known deposition method such as physical vapor deposition (PVD) or chemical vapor deposition (CVD).

A portion of the growth layer 10 having a BPD density of <100/cm² formed by the growth step S1 may be treated as a substrate 111. The substrate 111 has a dopant concentration of, for example, $1.0 \times 10^{17}/cm^3$ or more.

As used herein, the term "the workpiece 1" refers to the workpiece 1 including the growth layer 10 if it is in the growth step S1 or later. It can be understood that "various treatments on the workpiece 1" by the device formation step S2 and the separation step S3 described below are "various treatments on the growth layer 10 included in the workpiece 1".

<<Device Formation Step S2>>

Figure 3:
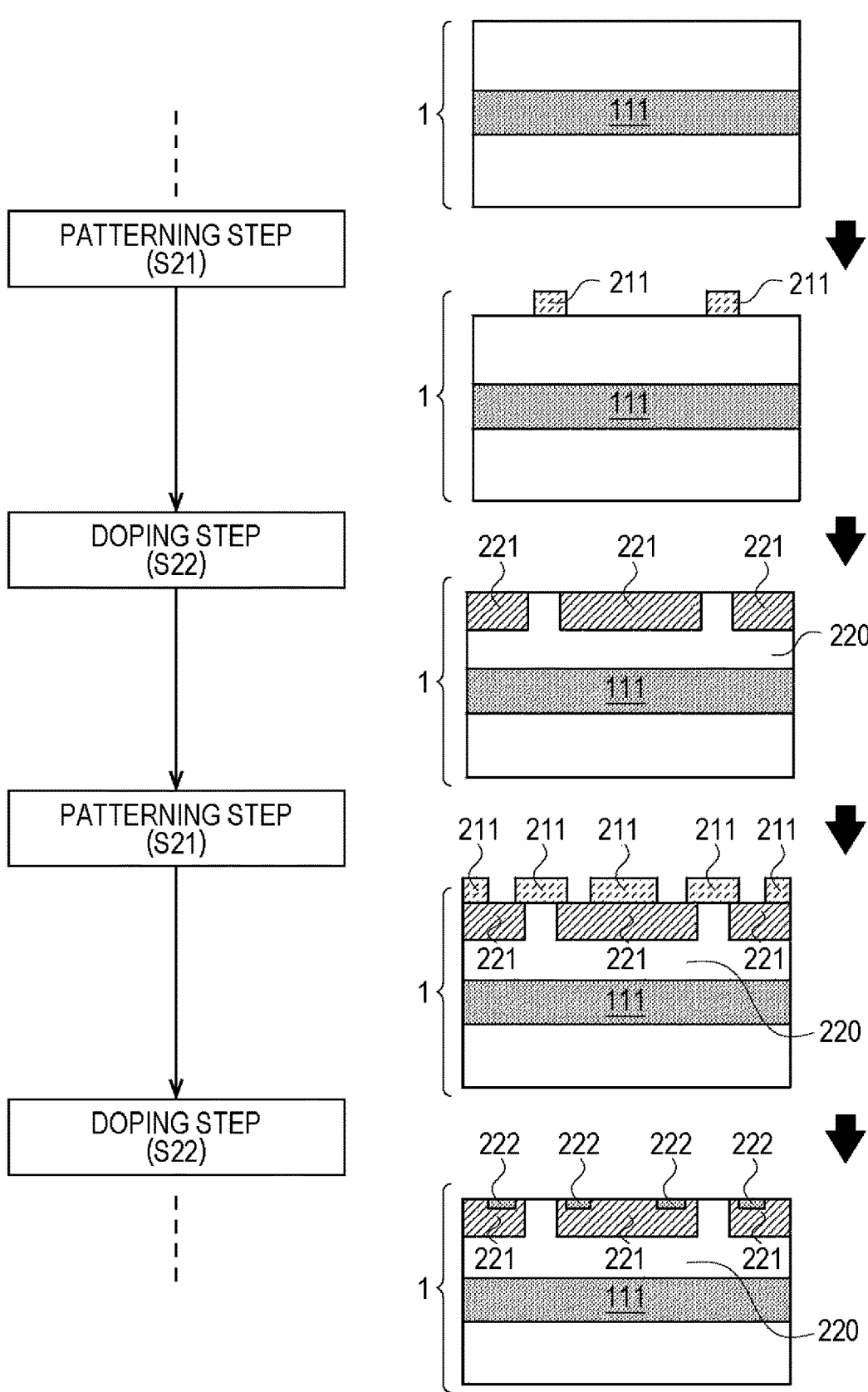
FIG. 3 schematically illustrates a portion of the device formation step.

As illustrated in FIG. 3, the device formation step S2 includes a patterning step S21 of forming a circuit pattern 211 on the workpiece 1 having the growth layer 10.

<Patterning Step S21>

The patterning step S21 includes, for example, a resist coating step of applying a photoresist, an exposure step of exposing the photoresist through a photomask, and a development step of developing the exposed photoresist.

The resist coating step includes applying a known photoresist, which contains a base resin that selectively reacts to the wavelength of the light source that may be used in the exposure step described below, onto the workpiece 1.

The photoresist is, for example, a polymer material containing a novolac resin and a 1,2-naphthoquinone diazide sulfonate (NQD) compound when the light source is a g-ray (wavelength: 436 nm). As another example, when the light source is an ArF laser (wavelength: 193 nm), the photoresist is a polymer material containing a base resin with alicyclic groups such as norbornene that can suppress light absorption near the 200 nm wavelength.

The resist coating step includes applying a photoresist to the workpiece 1 by using a known resist coater such as a spin coater or spray coater.

In the resist coating step, the process conditions such as spin-coating rotation speed and drop volume are set or optimized to obtain the desired thickness of the photoresist.

In the resist coating step, a silicifying agent that removes hydroxyl groups, such as hexamethyldisilazane (HMDS), may be applied to the surface of the workpiece 1 prior to the application of the photoresist so that hydrophobicity is imparted to the surface of the workpiece 1.

The resist coating step includes, after the photoresist is applied to the workpiece 1, heat-treating the photoresist and the workpiece 1 for pre-baking.

In the resist coating step, the process conditions such as heating temperature and heating time for pre-baking are set or optimized so that the desired film thickness and surface roughness for the photoresist can be obtained, or so that the circuit pattern 211 can be transferred appropriately.

The exposure step includes exposing a portion of the photoresist applied to the workpiece 1 using a known exposure system such as a close exposure system or a reduced projection exposure system that includes a known light source, optical system, and stage, and a photomask that presents a circuit pattern 211. The projection method for the optical system may be any known projection method such as the lens method or the mirror method. In the exposure system, exposure may be performed without using a tangible photomask in the form of maskless exposure.

In the exposure step, the process conditions such as exposure time are set or optimized as appropriate to ensure that the circuit pattern 211 is transferred appropriately.

The exposure step may use a light source such as g-ray (wavelength: 436 nm), ray (wavelength: 365 nm), KrF laser (wavelength: 248 nm), ArF laser (wavelength: 193 nm), $F_2$ laser (wavelength: 157 nm), $Kr_2$ laser (wavelength: 146 nm), $Ar_2$ laser (wavelength: 126 nm), soft X-rays (Extreme Ultraviolet: EUV, wavelength: ~13.5 nm), electron beams, or X-ray. In the exposure step, pure water may be inserted between the projection optics and the workpiece 1 in the form of immersion lithography, thereby improving the refractive index.

In the exposure step, the photoresist may be heat-treated after exposure for baking (post exposure baking: PEB).

In the exposure step, the process conditions such as heating temperature and heating time for the baking are set or optimized so that the circuit pattern 211 is transferred appropriately.

The development step includes removing (developing) a portion of the exposed photoresist with a developing solution. In the developing step, the material of the developing solution may be selected as appropriate according to the material of the photoresist. The developing solution contains, for example, tetramethylammonium hydroxide (TMAH).

In the development step, the process conditions such as the temperature of the developing solution and the development time are set or optimized so that the circuit pattern 211 is transferred appropriately.

The development step includes post-baking the photoresist that has been developed.

In the development step, the process conditions such as heating temperature and heating time for the baking are set or optimized so that the circuit pattern 211 is transferred appropriately.

The patterning step S21 may include, before the resist coating step, for example, a hard mask formation step of forming a hard mask to be used as a sacrificial layer on the workpiece 1 based on a known deposition method such as the PVD or CVD method.

In the hard mask formation step, a material that exhibits high hardness and low stress may be used as a hard mask, such as silicon oxide such as $SiO_2$ or TEOS-$SiO_2$, silicon nitride such as SiN or $Si_3N_4$, silicon oxynitride such as SiON, a boron nitride such as BN, titanium nitride such as TiN, or a mixture thereof. The hard mask may be configured to include, for example, B elements as appropriate.

In the patterning step S21, a hard mask and a photoresist may be deposited in this order, or a hard mask, an anti-reflection film such as a carbon film, and a photoresist may be deposited in this order, or deposition forming a multilayer structure may be performed.

The patterning step S21 may be configured to include depositing only a photoresist on the workpiece 1, treating the photoresist as a hard mask having heat resistance, etching resistance, and ion blocking ability, and transferring the circuit pattern 211.

In the patterning step S21, the circuit pattern 211 may be transferred to the workpiece 1 in the form of nanoimprinting, using, for example, a mold containing $SiO_2$ material.

The line width of the circuit pattern 211 formed in an embodiment of the present invention is preferably 10 μm or less, more preferably 5.0 μm or less, even more preferably 2.0 μm or less, yet even more preferably 1.0 μm or less, yet even more preferably 0.5 μm or less, yet even more preferably 0.2 μm or less, yet even more preferably 0.1 μm or less, yet even more preferably 50 nm or less, yet even more preferably 20 nm or less, and yet even more preferably 10 nm or less. In addition, the line width is preferably 1.0 nm or more, more preferably 10 nm or more, more preferably 20 nm or more, more preferably 50 nm or more, more preferably 0.1 μm or more, more preferably 0.2 μm or more, more preferably 0.5 μm or more, more preferably 1.0 μm or more, still more preferably 2.0 μm or more, and still more preferably 5.0 μm or more.

The device formation step S2 includes, after the patterning step S21, a selective etching step of etching the exposed surface below the photoresist using the photoresist that presents the circuit pattern 211.

The selective etching step includes etching the exposed surface on the workpiece 1 so as to present material selectivity. As used herein, the term "exhibit material selectivity" refers, for example, to the difference in etching rates for the photoresist and SiC single crystal.

The selective etching step includes etching the exposed surface on the workpiece 1 by, for example, wet etching.

In the selective etching step, the process conditions such as etchant, etching time, and etching temperature are set or optimized to achieve the desired material selectivity, surface orientation dependency, etching rate, and others. Examples of the solution containing the etchant include a TMAH solution, a potassium hydroxide (KOH) solution, a potassium permanganate ($KMnO_4$) solution, and a hydrogen fluoride (HF) solution.

In the selective etching step, the exposed surface on the workpiece 1 is etched by known thermal etching such as reactive gas etching.

In the selective etching step, the process conditions such as etchant (reaction gas), partial pressure related to the reaction gas, and heat treatment temperature are set or optimized to achieve the desired material selectivity, surface orientation dependency, etching rate, and others. The etchant is, for example, a mixture of $H_2$, HCl, $Cl_2$, $O_2$, or $ClF_3$.

In the selective etching step, for example, the exposed surface on the workpiece 1 is etched by, for example, known dry etching such as reactive ion etching (ME). In the reactive ion etching, plasma is formed by a known method such as ICP or CCP, and known gases such as Ar gas, $O_2$ gas, $NF_3$ gas, $PF_3$ gas, $BF_3$ gas, $CF_4$ gas, $CHF_3$ gas, $SF_6$ gas, and $XeF_2$ are combined as appropriate.

In the selective etching step, the process conditions such as bias power, gas type, gas partial pressure, and discharge time are set or optimized to achieve the desired anisotropy, etching rate, and others.

In the selective etching step, anisotropic etching or deep etching may be performed to form a three-dimensional shape such as a U-groove or V-groove on the workpiece 1.

<Doping Step S22>

As illustrated in FIG. 3, the device formation step S2 includes a doping step S22 of introducing dopant atoms into the workpiece 1 to form n type and/or p type regions in the workpiece 1, or to form pn junction regions.

The doping step S22 includes, for example, an ion implantation step of irradiating dopant ions, which are ionized dopant atoms, onto the workpiece 1, and an activation step of irradiating the workpiece 1 with dopant ions is heat-treated to activate it.

The ion implantation step includes, for example, a beam extraction step of extracting an ion beam from an ion source containing a dopant element, a mass analysis step of mass-separating the desired ion species among the ion species contained in the ion beam, an acceleration step of applying acceleration energy to the ion beam containing the mass-separated ion species, and a scanning step of scanning the ion beam with the accelerated energy and irradiate it onto the workpiece 1. The ion implantation step includes irradiating dopant ions to the desired region using the circuit pattern 211, which is a sacrificial layer having ion blocking ability.

In the ion implantation step, for example, a known dopant element such as an N, P, Al, or B element is ionized and irradiated onto the workpiece 1. At this time, the N and P elements are added to the SiC single crystals to form the n type region, and the Al and B elements are added to the SiC single crystals to form the p type region.

Elements that form n type or p type regions in the SiC single crystals can be used as the dopant ions as appropriate.

In the ion implantation step, a non-dopant element such as C element, Si element, Cl element, or Ar element can be ionized and irradiated onto the workpiece 1 in the same manner as above.

The beam extraction step includes extracting an ion beam containing dopant ions from an ion source containing a dopant element installed in a vacuum chamber to obtain the desired mean free path.

In the beam extraction step, for example, the ion beam is extracted by, for example, applying an extraction voltage to the ion source. In the beam extraction step, the ion beam is extracted by, for example, ionizing the ion source in a plasma environment.

The ion source may be a solid material, a gaseous material, a liquid metal ion source (LMIS), or a combination of a support gas and a solid material to form a plasma environment that promotes ionization. The plasma environment is formed as appropriate based on a known method using a DC or AC power supply.

The mass spectrometry step includes analyzing the mass and charge ratio (m/z) for the ion beam containing the dopant ions drawn by the beam extraction step so that the desired ion species is mass separated. In the mass spectrometry step, for example, the ion beam is passed through a magnetic field while a voltage is applied to it, and the voltage and/or magnetic field strength is adjusted to select the m/z corresponding to the ion species.

The mass spectrometry step may use any known mass spectrometry such as fan field, quadrupole, time-of-flight (TOF), or ion trap type as appropriate.

The acceleration step includes applying acceleration energy to the ion beam containing the dopant ions to achieve the desired ion implantation depth or to achieve the desired dopant profile. The acceleration step may be performed after the mass spectrometry step or before and after the mass spectrometry step.

The scanning step includes scanning an ion beam containing dopant ions over at least a portion of the surface of the workpiece 1, which is the target installed in the vacuum chamber, thereby imparting an implantation angle to the dopant ions. In the scanning step, the beam current of the ion beam irradiated on the target may be evaluated, such as by using a Faraday cup. The beam current and beam irradiation time are used to evaluate the amount of dose for the ion beam.

In the ion implantation step, the process conditions such as acceleration energy, implantation angle, and dose amount are set or optimized so that the desired dopant profile is formed.

In the ion implantation step, co-ion implantation may be performed such that two or more ion species are irradiated. The two or more ion species may be, for example, a plurality of dopant ions, or a C ion and a dopant ion, and there is no limit to the combination thereof.

In the ion implantation step, the dopant ions may be irradiated onto the workpiece 1 a plurality of times to form the desired dopant profile, or the dopant ions may be irradiated onto the workpiece 1 while changing the acceleration energy in a plurality of steps, or the dopant ions may be irradiated onto the workpiece 1 while heating the workpiece 1.

In the ion implantation step, the dopant ions may be irradiated onto the workpiece 1 to form a box profile in which the dopant concentration is constant. As used herein, the term "desired dopant profile" may be varied as appropriate depending on the structure of the SiC semiconductor device to be produced.

The activation step includes heat-treating the workpiece 1 that has been irradiated with dopant ions in an inert atmosphere such as Ar atmosphere to recover the crystal damage caused by the dopant ion irradiation and to activate the dopant ions.

In the activation step, the process conditions such as heating temperature, heating time, and partial pressure are set or optimized so that the desired dopant profile is formed or the activation rate of the dopant ions concerned is increased.

In the activation step, for example, a carbon layer or a passivation film such as $SiO_2$ is deposited on the surface of the workpiece 1 to prevent carbonization of the surface of the workpiece 1.

The doping step S22 includes introducing dopant atoms into the workpiece 1 to form n+ and/or n− regions, p+ and/or p− regions, n type or p type drift regions 220, n type or p type well regions 221, n type or p type contact regions 222, to form n type or p type body regions, n type or p type base regions, n type or p type source regions, n type or p type collector regions, n type or p type field stop regions, n type or p type pillar regions, n type or p type buffer regions, n type or p type recombination promotion regions, n type or p type buried regions, a halo structure, a shallow junction structure, or a super junction structure.

In the doping step S22, dopant atoms are introduced into the workpiece 1 to form n type or p type regions that exhibit profiles similar to those found in known Si-based electronic devices.

As used herein, the term "region" included in the n type region, drift region, and others can be understood to be the same as the "layer" included in the n type layer, drift layer, and others.

The dopant concentration in the n type or p type region formed by the doping step S22 is preferably $1.0 \times 10^{21}/cm^3$ or less, more preferably $1.0 \times 10^{20}/cm^3$ or less, even more preferably $1.0 \times 10^{19}/cm^3$ or less, yet even more preferably $1.0 \times 10^{18}/cm^3$ or less, yet even preferably $1.0 \times 10^{17}/cm^3$ or less, and yet even more preferably $1.0 \times 10^{16}/cm^3$ or less. The dopant concentration is preferably $1.0 \times 10^{15}/cm^3$ or more, more preferably $1.0 \times 10^{16}/cm^3$ or more, even more preferably $1.0 \times 10^{17}/cm^3$ or more, yet even more preferably $1.0 \times 10^{18}/cm^3$ or more, yet even more preferably $1.0 \times 10^{19}/cm^3$ or more, and yet even more preferably $1.0 \times 10^{20}/cm^3$ or more.

The dopant concentration may differ between different regions, such as the n type contact region and drift region.

In the doping step S22, dopant atoms may be introduced to the workpiece 1 after the patterning step S21 each time SiC epitaxial growth is performed. The SiC epitaxial growth may be performed by the growth step S1 or by known deposition methods such as PVD or CVD.

As illustrated in FIG. 3, in the device formation step S2, the patterning step S21 and the doping step S22 may be repeated.

In the device formation step S2, the SiC epitaxial growth, patterning step S21 and doping step S22 may be repeated based on the plurality of circuit patterns 211.

In the device formation step S2, the SiC epitaxial growth and doping step S22 may be performed without the patterning step S21.

In the device formation step S2, each time the doping step S22 is performed, the photoresist and/or hard mask that presents the circuit pattern 211 is etched.

<Insulating Film Formation Step S23>

Figure 4:
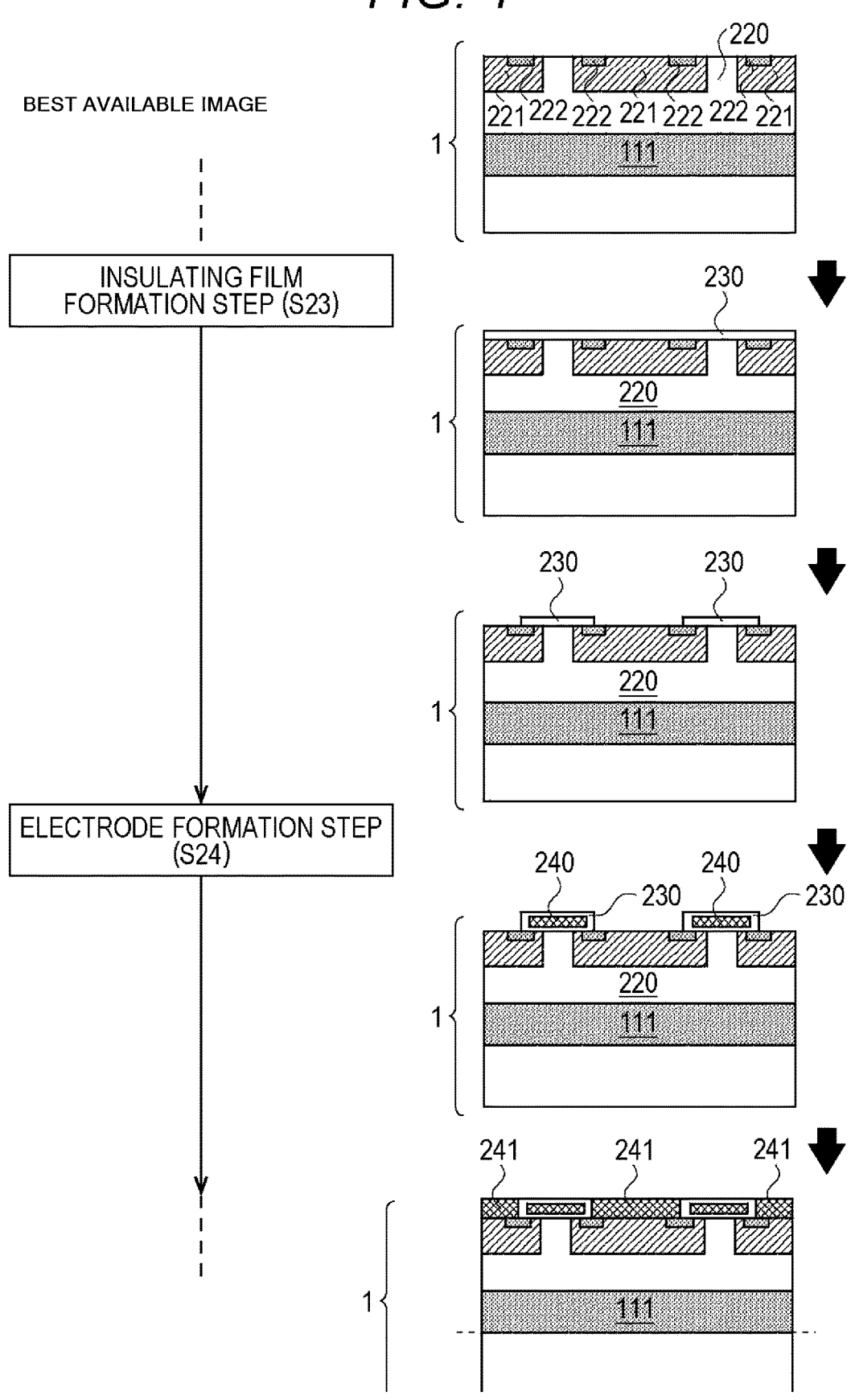
FIG. 4 schematically illustrates a portion of the device formation step.

As illustrated in FIG. 4, the device formation step S2 includes an insulating film formation step S23 of introducing an insulating film 230 into the workpiece 1.

The insulating film 230 functions, for example, as a gate insulating film in a SiC semiconductor device having a FET structure, as an interlayer insulating film for device separation, or as a cap layer for adjusting the flat-band voltage at a gate electrode 240.

The equivalent oxide thickness (EOT) of the insulating film 230 formed by the insulating film formation step S23 is preferably 100 nm or less, more preferably 50 nm or less, even more preferably 20 nm or less, yet even more preferably 10 nm or less, yet even more preferably 5.0 nm or less, and yet even more preferably 2.0 nm or less. The EOT is preferably 1.0 nm or more, more preferably 2.0 nm or more, even more preferably 5.0 nm or more, yet even more preferably 10 nm or more, yet even more preferably 20 nm or more, and yet even more preferably 50 nm or more.

In the insulating film formation step S23, for example, the workpiece 1 is thermally oxidized using a known oxidation furnace and an oxidizing species such as dry oxygen ($O_2$) or water vapor ($H_2O$) to form a thermally oxidized $SiO_2$ film.

At this time, in the insulating film formation step S23, process conditions such as oxidation temperature, oxidation time, and partial pressure of the oxidizing species gas are set or optimized so that the interface level density at the $SiC/SiO_2$ interface is reduced, the $SiC/SiO_2$ interface roughness is reduced, carbon residue in the thermally oxidized $SiO_2$ film is suppressed, or CO gas generation in the thermal oxidation reaction is promoted.

In the insulating film formation step S23, a dry process using heat treatment or plasma environment may be performed after the insulating film 230 is deposited so as to reduce the interface level density at the insulating film interface.

In the insulating film formation step S23, for example, nitridation may be performed after the formation of the above thermally oxidized $SiO_2$ film so that the interface level density at the $SiC/SiO_2$ interface is reduced. The nitriding treatment may be a heat treatment under a nitric oxide (NO) atmosphere, or a treatment that uses a plasma environment in which NO or other oxidized nitrogen is excited.

In the insulating film formation step S23, the insulating film 230 may be formed based on known deposition methods such as CVD or atomic layer deposition (ALD). At this time, the insulating film 230 may be configured to include a metal oxide film such as $Al_2O_3$ film or AlON film in addition to a Si oxide film such as a thermally oxidized $SiO_2$ film.

<Electrode Formation Step S24>

Figure 5:
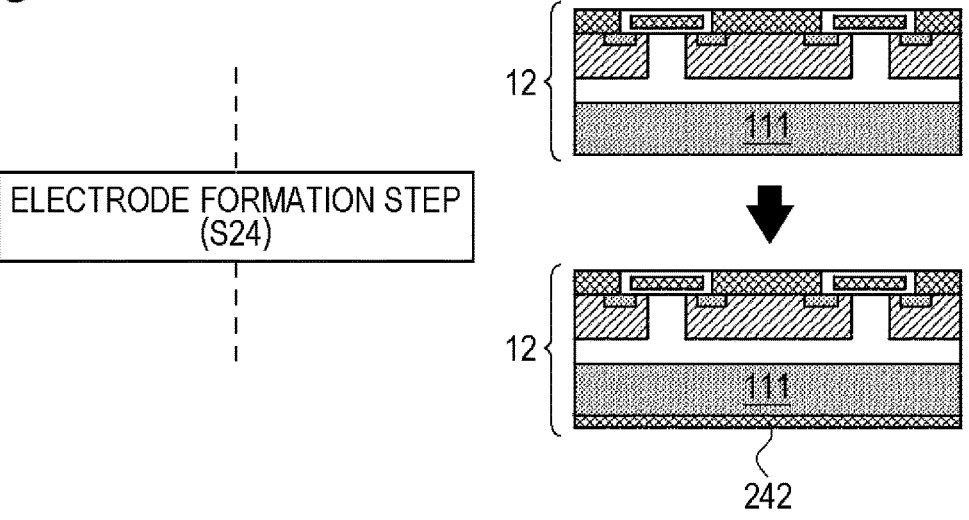
FIG. 5 schematically illustrates the electrode formation step after the separation step.

As illustrated in FIGS. 4 and 5, the device formation step S2 includes an electrode formation step S24 of forming an electrode on the workpiece 1.

The electrode formation step S24 includes forming an electrode on the workpiece 1 to form the gate electrode 240, a source electrode 241, a drain electrode 242, a base electrode, an emitter electrode, a collector electrode, an anode electrode, a cathode electrode, an ohmic electrode, or a Schottky electrode.

In the electrode formation step S24, for example, poly-Si is deposited on the workpiece 1 by a deposition step based on a known technique such as CVD. The poly-Si is processed as the gate electrode 240 adjacent to the insulating film 230 by, for example, the patterning step S21, the doping step S22, and a selective etching step. In the electrode formation step S24, a metal material other than poly-Si may be used as the gate electrode 240 instead of/in addition to poly-Si.

In the electrode formation step S24, for example, a metal film such as Ni is deposited on the workpiece 1 by the PVD method, and the metal film is formed as the source electrode 241, which is an ohmic electrode adjacent to the n type or p type contact region 222, or as the drain electrode 242 by the patterning step S21, the doping step S22, and the selective etching step.

In the electrode formation step S24, a silicidation reaction may be performed by heat-treating the workpiece 1 after the formation of the metal film. In the electrode formation step S24, a barrier metal such as TiN or TaN may be stacked on electrodes such as the source electrode 241 and drain electrode 242.

In the electrode formation step S24, process conditions such as heat treatment temperature and time in the silicidation reaction are set or optimized so that a Schottky electrode is formed or an ohmic electrode is formed by the dopant segregation effect.

As illustrated in FIG. 5, in the electrode formation step S24, after the separation step S3, a metal film such as Ni may be deposited on the workpiece 1 by the PVD method to form the drain electrode 242, which is an ohmic electrode adjacent to the n type or p type region, as the back surface electrode.

In the device formation step S2, the insulating film 23 or electrode formed by the insulating film formation step S23 or electrode formation step S24 may be used as the aforementioned hard mask.

As used herein, the term "CVD" refers to known CVD methods such as thermal CVD, plasma-enhanced CVD (PECVD), or metal organic CVD (MOCVD), and may be used as a deposition method in introducing any of the various materials constituting the SiC semiconductor device 12.

As used herein, the term "PVD method" refers to known PVD methods such as vacuum deposition, DC sputtering, RF sputtering, magnetron sputtering, reactive sputtering, or molecular beam epitaxy (MBE), and may be used as a deposition method as appropriate in introducing any of the various materials constituting the SiC semiconductor device 12.

In the device formation step S2, for example, the doping step S22, the insulating film formation step S23, or the electrode formation step S24 may be performed after the selective etching step so that the SiC semiconductor device 12 having a trench gate structure is produced.

In the device formation step S2, at least a portion of the insulating film formation step S23 may be performed after the electrode formation step S24.

In an embodiment of the present invention, depending on the structure of the SiC semiconductor device 12, at least a portion of each step included in the device formation step S2 may be performed in random order so that the desired structure of the SiC semiconductor device 12 is realized.

In an embodiment of the present invention, the device formation step S2 may include forming a wiring area.

<<Separation Step S3>>

The separation step S3 includes separating a portion of the workpiece 1.

In the separation step S3, multi-wire saw cutting, which cuts by reciprocating a plurality of wires, the EDM method, which cuts by intermittent plasma discharge, and the laser irradiation method, which forms a layer that serves as the base point for cutting, may be used.

Figure 6:
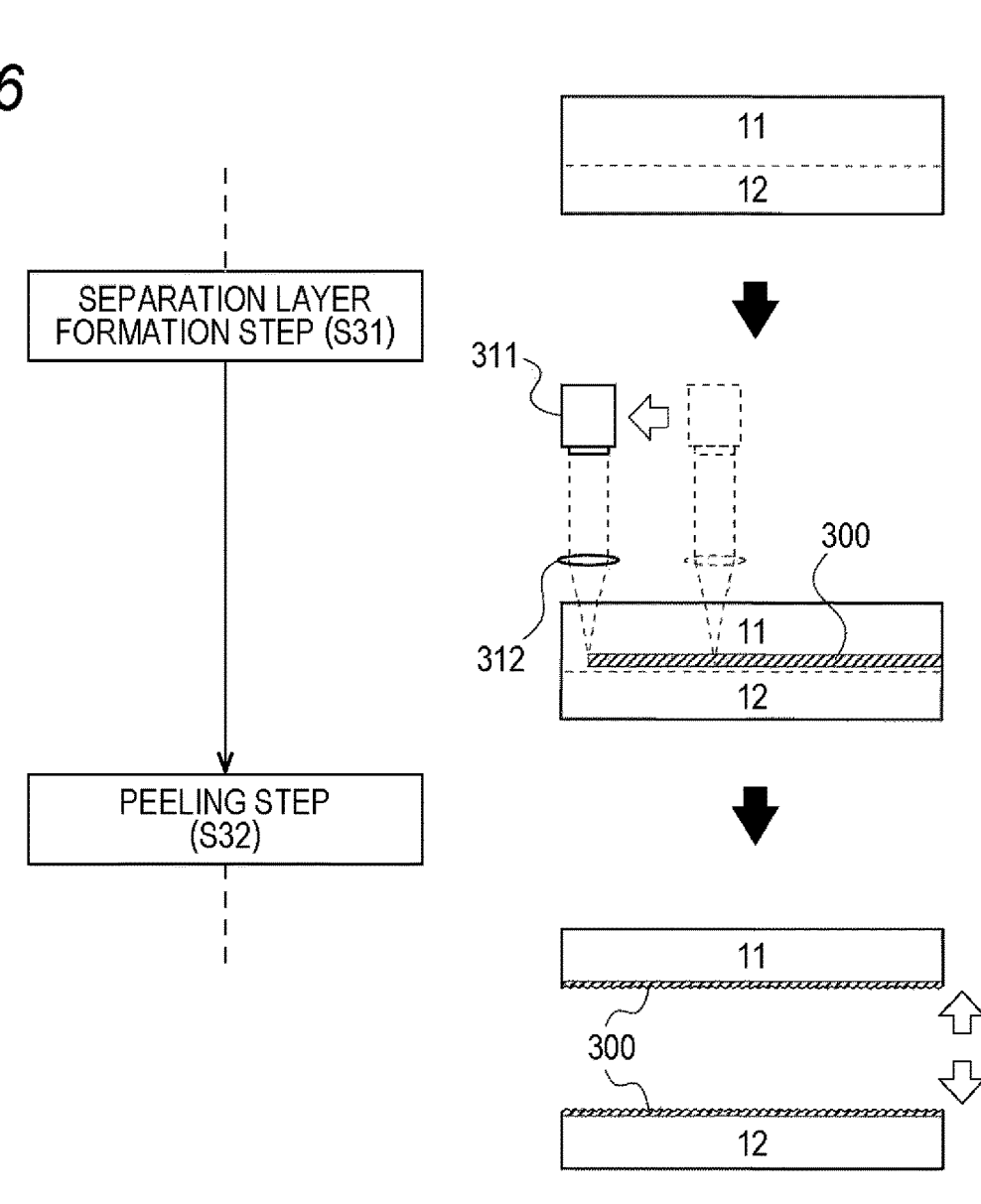
FIG. 6 schematically illustrates the separation step.

As illustrated in FIG. 6, the separation step S3 includes a separation layer formation step S31 of forming a separation layer 300 inside the workpiece 1, and a peeling step S32 of peeling off a portion of the workpiece 1 starting from a separation layer 300.

<Separation Layer Formation Step S31>

The separation layer formation step S31 includes forming the separation layer 300 by irradiating and focusing, onto the workpiece 1, laser light of a wavelength that is transmissive in the workpiece 1 so that the inside of the workpiece 1 becomes the focal point at a depth corresponding to the thickness of the SiC semiconductor device 12 to be separated from the top surface.

At this time, in the separation layer formation step S31, the laser is preferably irradiated onto the surface of the workpiece 1 where the SiC semiconductor device 12 is not formed.

In the separation layer formation step S31, the separation layer 300 is formed by using holding means capable of holding the workpiece 1 based on a known method such as an absorption chuck, a light source 311 capable of irradiating a pulse oscillating laser, and a known light collecting means 312 such as a lens capable of focusing the laser.

In the separation layer formation step S31, for example, an infrared laser is used as the relevant laser.

The wavelength of the laser may be classified as ultraviolet light or visible light, and is not limited.

In the separation layer formation step S31, process conditions such as laser wavelength, laser power, laser scanning speed, beam spot diameter, pulse width, and pitch width are set or optimized so that the SiC semiconductor device 12 can be suitably separated from the workpiece 1.

<Peeling Step S32>

The peeling step S32 includes peeling off the SiC semiconductor device 12, which is a portion of the workpiece 1, starting from the separation layer 300. At this time, in the peeling step S32, the SiC semiconductor device 12 is peeled off from the workpiece 1 starting from the separation layer 300 by applying mechanical vibration to the workpiece 1 by reciprocating a wire along the separation layer 300 or by generating ultrasonic vibration.

In the peeling step S32, the SiC semiconductor device 12 is peeled off from the workpiece 1 starting from the separation layer 300 using at least some of the following: a holding means capable of holding the workpiece 1 based on a known method such as an absorption chuck, a vibration means made of piezoelectric ceramics capable of generating known mechanical vibrations including ultrasonic vibrations, and a liquid supply means capable of supplying a liquid such as pure water.

In the separation step S3, a polymer layer, which is a stress generating layer, may be formed on the workpiece 1 prior to the separation layer formation step S31 or prior to the peeling step S32.

At this time, in the peeling step S32, the workpiece 1 including the polymer layer may be cooled to induce crack propagation in the separation layer 300, thereby peeling off the SiC semiconductor device 12 from the workpiece 1 starting from the separation layer 300.

At this time, in the peeling step S32, process conditions such as the composition and thickness of the polymer layer, cooling temperature, cooling speed, and cooling time are set or optimized so that the SiC semiconductor device 12 can be suitably separated from the workpiece 1.

At this time, in the separation step S3, the polymer layer is preferably formed on the surface of the workpiece 1 where the SiC semiconductor device 12 is not formed so as to suppress stress generation in the SiC semiconductor device 12.

The separation step S3 may use known techniques.

In the separation step S3, at least some of the devices and methods described in patent literatures such as JP 2013-

49161 A, JP 2018-207034 A, JP 2017-500725 A, and JP 2017-526161 A may be used.

In addition, in the separation step S3, at least some of the devices and methods described in patent literatures such as JP 2017-526161 A, JP 2017-500725 A, JP 2018-152582 A, JP 2019-500220 A, and JP 2019-511122 A may be used.

<<Etching Step S4>>

Figure 7:
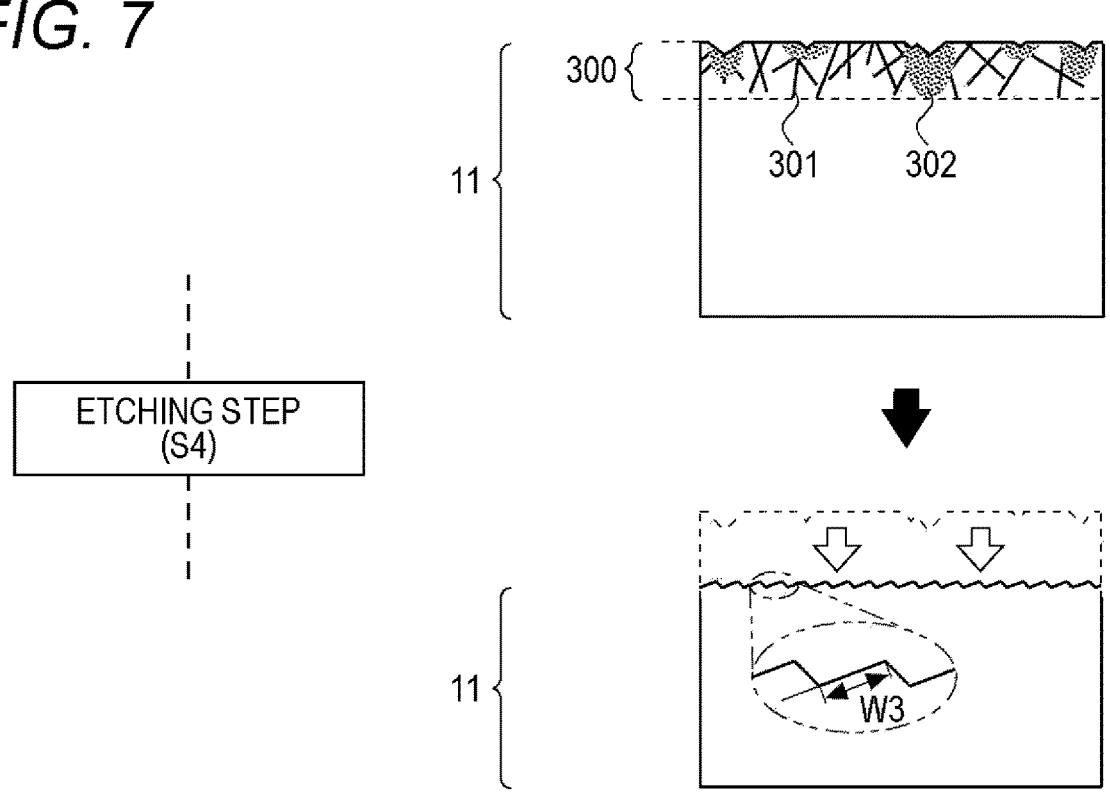
FIG. 7 schematically illustrates the etching step.

As illustrated in FIG. 7, the etching step S4 includes etching the workpiece 1 to form a planarized, bunching-free surface that presents a reduced terrace length W3. The mechanism for the etching step S4 will be described later.

In the etching step S4, for example, the workpiece 1 separated by the separation step S3 is heat-treated to etch the surface layer including the separation layer 300 remaining in the workpiece 1. It can be understood that the separation layer 300 includes a crystal dislocation 301 and a damaged region 302. At this time, the surface of the growth layer 10 can be terminated with the step that presents the height of a full unit in the SiC single crystals. The separation layer 300 is also understood as a strain layer or damage layer.

The etching step S4 also includes a strain layer removal step S41 of placing and heating the workpiece 1 in a semi-closed space having an atomic number ratio Si/C of 1 or less to etch the workpiece 1. The etching step S4 also includes a bunching decomposition step S42 of placing and heating the workpiece 1 is placed in a semi-closed space having an atomic number ratio Si/C of more than 1 to etch the workpiece 1.

The strain layer removal step S41 includes etching the separation layer 300, and etching the workpiece 1 so that the bunched surface is exposed.

The bunching decomposition step S42 includes etching the workpiece 1 to decompose MSBs on the surface of the workpiece 1 so as to form a planarized, bunching-free surface. At this time, the surface is terminated with the step that presents the height of a full unit in the SiC single crystals.

As illustrated in FIG. 8, in an embodiment of the present invention, a plurality of steps, including at least the growth step S1, the device formation step S2, and the separation step S3, may be repeated to form a cycle.

In an embodiment of the present invention, the growth step S1, the device formation step S2, the separation step S3, and the etching step S4 may be repeated to form a cycle.

In an embodiment of the present invention, at least a portion of each step of the device formation step S2 may be performed after the separation step S3.

In an embodiment of the present invention, for example, a SiC semiconductor device 12 with known device structures, including a Schottky barrier diode (SBD), a bipolar junction transistor (BJT), a FET, an insulated gate bipolar transistor (IGBT), and a combination thereof, can be produced.

As illustrated in FIG. 9, an embodiment of the present invention can produce a SiC semiconductor device 12 that includes an n type or p type substrate 111 such that it is adjacent to electrode surfaces such as drain, anode, and collector electrodes.

As illustrated in FIG. 9(a), an embodiment of the present invention can produce a SiC semiconductor device 12 having a FET structure including an n type or p type substrate 111, an n type or p type drift region 220, an n type or p type well region 221, an n type or p type contact region 222, an insulating film 230, a gate electrode 240, a source electrode 241, and a drain electrode 242.

As illustrated in FIG. 9(b), an embodiment of the present invention can produce a SiC semiconductor device 12 having an SBD structure including an n type or p type substrate 111, a low concentration region 226, an anode electrode 244, and a cathode electrode 245.

The thickness of then type or p type substrate 111 is not limited within the range of the thickness of the growth layer 10. The n type or p type substrate 111, for example, contributes to the realization of ohmic electrodes.

An embodiment of the present invention can produce a SiC semiconductor device 12 having a planar gate type structure. The SiC semiconductor device 12 may have a known device structure such as an FET structure or an IGBT structure.

An embodiment of the present invention can produce a SiC semiconductor device 12 having a trench gate type structure so that JFET resistance during device operation is reduced. The SiC semiconductor device 12 may have a known device structure such as an FET structure or an IGBT structure.

An embodiment of the present invention can produce a known SiC semiconductor device 12 having a superjunction structure that includes an n type or p type pillar region to reduce drift resistance during device operation. The SiC semiconductor device 12 may have a known device structure such as an FET structure or an IGBT structure.

An embodiment of the present invention can produce a SiC semiconductor device 12 that includes an n type or p type buried region so that the field concentration effect is mitigated during device operation.

For example, the n type or p type buried region in the SiC semiconductor device 12 may be installed below the gate electrode 240 along the film thickness direction, below the source electrode 241 along the film thickness direction, or may be installed to present a guard ring aligned with the n type or p type well region along the direction perpendicular to the film thickness direction.

An embodiment of the present invention can produce a SiC semiconductor device 12 that includes a growth layer having a basal plane dislocation density (BPD density) of $<100/cm^2$, a growth layer having a BPD density of $<10/cm^2$, or a growth layer having a BPD density of $<1.0/cm^2$. As described above, the growth layer is at least a portion of the growth layer 10.

The growth layer refers to at least a portion of the SiC structure that constitutes the SiC semiconductor device 12, including the n type or p type region.

The growth layer also refers, for example, to the n type or p type substrate 111.

The growth layer also refers, for example, an $n^+$ or $p^+$ region having a dopant concentration of $1.0 \times 10^{17}/cm^3$ or more, $2.0 \times 10^{17}/cm^3$ or more, $5.0 \times 10^{17}/cm^3$ or more, $1.0 \times 10^{18}/cm^3$ or more, $2.0 \times 10^{18}/cm^3$ or more, or $5.0 \times 10^{18}/cm^3$ or more.

The cell pitch of the SiC semiconductor device 12 produced in an embodiment of the present invention is preferably 10 μm or less, more preferably 5.0 μm or less, even more preferably 2.0 μm or less, yet even more preferably 1.0 μm or less, yet even more preferably 0.5 μm or less, yet even more preferably less than 0.2 μm, yet even more preferably less than 0.1 μm, yet even more preferably less than 50 nm, yet even more preferably less than 20 nm, and yet even more preferably less than 10 nm. The cell pitch is preferably 1.0 nm or more, more preferably 10 nm or more, even more preferably 20 nm or more, even more preferably 50 nm or more, yet even more preferably 0.1 μm or more, yet even more preferably 0.2 μm or more, yet even more preferably 0.5 μm or more, yet even preferably 1.0 μm or more, yet even more preferably 2.0 μm or more, and yet even more preferably 5.0 μm or more.

<Mechanism of Growth Step S1 and Etching Step S4>

The raw material transport mechanism for the heat treatment step, which is the growth step S1 or the etching step S4 is described herein.

In an embodiment of the present invention, in the heat treatment step, the workpiece 1 and the SiC material 4 are heat-treated so that a temperature difference is formed between the workpiece 1 and the SiC material 4.

In the heat treatment step as the growth step S1, the workpiece 1 is placed at a low temperature side and grown to form the growth layer 10 on the surface of the workpiece 1.

In the heat treatment step as the etching step S4, the workpiece 1 is placed on the high temperature side to etch the workpiece 1 and remove the separation layer 300, for example.

As illustrated in FIG. 10, when the workpiece 1 is placed on the low temperature side, the formation of the growth layer 10 on a back surface 1a and the etching of the SiC material 4 (main surface 4a) are performed simultaneously.

In each of the growth step S1 and etching step S4, the workpiece 1 and the SiC material 4 are heat-treated in a semi-closed space in an atmosphere containing Si and C elements.

As used herein, the term "semi-closed space" refers to a space in which at least a portion of the vapor generated in the container can be confined, although the vacuation in the space is still possible.

As illustrated in FIG. 11, raw material transport based on the following reactions 1) to 5) is continuously carried out in the workpiece 1 and the SiC material 4 to form the growth layer 10.

$$SiC(s) \rightarrow Si(v)+C(s)$$

$$2C(s)+Si(v) \rightarrow SiC_2(v) \qquad \qquad 2)$$

$$C(s)+2Si(v) \rightarrow Si_2C(v) \qquad \qquad 3)$$

$$Si(v)+SiC_2(v) \rightarrow 2SiC(s) \qquad \qquad 4)$$

$$Si_2C(v) \rightarrow Si(v)+SiC(s) \qquad \qquad 5)$$

1): As the surface of the SiC material 4 is pyrolyzed, Si atoms (Si(v)) are desorbed from the surface of the SiC material 4.

2) and 3): C atoms (C(s)) remaining on the surface of the SiC material 4 due to desorption of Si atoms (Si(v)) react with Si vapor (Si(v)) in the raw material transport space, and sublimate into the raw material transport space as, for example, $Si_2C$ or $SiC_2$.

4) and 5): The sublimed $Si_2C$, $SiC_2$, or the like reaches and diffuses into the terraces on the back surface 1a of the workpiece 1 due to the temperature gradient and takes over the polymorphism of the back surface 1a by reaching the steps, forming the growth layer 10 while presenting the aspect of step-flow growth.

The growth step S1 includes a Si atom sublimation step of thermally sublimating Si atoms from the SiC material 4, and a C atom sublimation step of sublimating C atoms remaining on the main surface 4a of the SiC material 4 by bonding them with Si atoms in the raw material transport space.

In the growth step S1, the growth layer 10 is formed on the back surface 1a of the workpiece 1 based on the aforementioned step-flow growth. The steps included in the growth step S1 are performed sequentially.

The growth step S1 is understood as a step based on physical vapor transport (PVT), because the transported $Si_2C$ or $SiC_2$ becomes supersaturated and condenses to form the growth layer 10.

With this configuration, the growth step S1 can suppress the formation of MSBs on the surface of the workpiece 1 and obtain a planarized SiC surface that presents a reduced terrace length.

The etching step S4 includes the Si atom sublimation step of thermally sublimating Si atoms from the surface of the workpiece 1, and the C atom sublimation step of sublimating C atoms remaining on the surface of the workpiece 1 by bonding them with Si atoms in the raw material transport space, and the surface of the workpiece 1 is etched. With this configuration, the etching step S4 can decompose the MSBs on the surface of the workpiece 1 and obtain a planarized SiC surface that presents a reduced terrace length.

It can be understood that the mechanism for each of the growth step S1 and etching step S4 is the transport of raw materials containing Si and C elements.

It can be understood that the driving force for the raw material transport is the vapor pressure difference between the workpiece 1 and the SiC material 4 due to the temperature gradient formed. Therefore, it can be understood that not only the temperature difference between the surfaces of the workpiece 1 and the SiC material 4, but also the chemical potential difference caused by the crystal structure between the workpiece 1 and the SiC material 4 can be the driving force for the raw material transport.

In each of the growth step S1 and the etching step S4, the SiC material 4 may be a SiC ingot produced by sublimation or other method, a SiC wafer sliced into a disk shape from the SiC ingot, or SiC polycrystals. The SiC material 4 may be a processed product such as a sintered body containing SiC polycrystals.

In each of the growth step S1 and the etching step S4, the SiC material that forms the semi-closed space and the SiC material exposed in the semi-closed space can be the SiC material 4.

In the raw material transport in the growth step S1, the dopant concentration in the growth layer 10 can be adjusted by supplying a dopant gas into the semi-closed space by a dopant gas supply means.

When no dopant gas is supplied, it can be understood that the growth layer 10 takes over the dopant concentration in the semi-closed space.

The raw material transport in each of the growth step S1 and the etching step S4 is preferably performed in an environment having a gas phase species containing Si elements and a gas phase species containing C elements.

The raw material transport in each of the growth step S1 and the etching step S4 is performed under a SiC—Si or SiC—C equilibrium vapor pressure environment, respectively.

As used herein, the term "SiC—Si vapor pressure environment" refers to the vapor pressure environment when SiC (solid) and Si (liquid) are in phase equilibrium through a vapor phase. The SiC—Si equilibrium vapor pressure environment is formed by heat-treating a semi-closed space having an atomic number ratio Si/C of more than 1.

As used herein, the term "SiC—C equilibrium vapor pressure environment" refers to the environment of vapor pressure when SiC (solid phase) and C (solid phase) are in phase equilibrium through a vapor phase. The SiC—C equilibrium vapor pressure environment is formed by heat-treating a semi-closed space having an atomic number ratio Si/C of 1 or less.

The heat treatment temperature in each of the growth step S1 and the etching step S4 is preferably 1400° C. or higher, more preferably 1500° C. or higher, even more preferably 1600° C. or higher, yet even more preferably 1700° C. or higher, yet even more preferably 1800° C. or higher, yet even preferably 1900° C. or higher, yet even more preferably 2000° C. or higher, yet even more preferably 2100° C. or higher, and yet even more preferably 2200° C. or higher.

The heat treatment temperature is preferably 2300° C. or lower, more preferably 2200° C. or lower, even more preferably 2100° C. or lower, even more preferably 2000° C. or lower, even more preferably 1900° C. or lower, even more preferably 1800° C. or lower, even more preferably 1700° C. or lower, even more preferably 1600° C. or lower, and even more preferably 1500° C. or lower.

The growth rate or etching rate for each of the growth step S1 and the etching step S4 is determined by the heat treatment temperature.

The temperature gradient between the workpiece 1 and the SiC material 4 in each of the growth step S1 and the etching step S4, is preferably 0.1° C./mm or more, more preferably 0.2° C./mm or more, even more preferably 0.5° C./mm or more, yet even more preferably 1.0° C./mm or more, and yet even more preferably 2.0° C./mm or more. The temperature gradient is preferably 5.0° C./mm or less, more preferably 2.0° C./mm or less, even more preferably 2.0° C./mm or less, yet even more preferably 1.0° C./mm or less, yet even more preferably 0.5° C./mm or less, and yet even more preferably 0.2° C./mm or less.

The temperature gradient may be uniform or distributed.

<Apparatus for Growth Step S1 and Etching Step S4>

The apparatus used in the growth step S1 and the etching step S4 are described in detail below. Components that are basically the same as those described in the previous producing method are marked with the same reference numerals to simplify their description.

As illustrated in FIG. 12, the producing apparatus according to the method for producing a SiC semiconductor device includes a main container 141, a refractory container 142, and a heating furnace 143.

The main container 141 includes a material that includes, for example, SiC polycrystals. Therefore, at least a portion of the main body container 141 can be the source of transport (SiC material 4) in raw material transport.

The environment in the heated main container 141 is preferably, for example, a vapor pressure environment of a mixed system of a gas phase species containing Si elements and a gas phase species containing C element. Examples of the gas phase species containing Si elements include Si, $Si_2$, $Si_3$, $Si_2C$, $SiC_2$, and SiC.

Examples of the gas phase species containing C elements include $Si_2C$, $SiC_2$, SiC, and C.

The dopant and dopant concentration of the main container 141 may be selected according to the dopant and dopant concentration of the growth layer 10 to be formed.

Any structure that generates vapor pressure of a gas phase species containing Si elements and a gas phase species containing C elements in the internal space during the heating treatment of the main container 141 may be used. Examples of the structure include a configuration in which the SiC polycrystals are partially exposed on the inner surface, and a configuration in which the SiC polycrystals are separately installed in the main container 141.

The main container 141 includes an installation tool 141a on which the workpiece 1 can be installed. The main container 141 is a fitting container including an upper container 141c and a lower container 141b that can be fitted to each other. A minute gap is formed at the fitting part of the upper container 141c and the lower container 141b, through which the inside of the main container 141 can be evacuated (vacuated).

<Si Vapor Supply Source>

The main container 141 has a Si vapor supply source. The Si vapor supply source is used to adjust the atomic number ratio Si/C of the semi-closed space in the main container 141 to be more than 1. Examples of the Si vapor supply source include solid Si (Si pellet such as Si pieces or Si powder) and Si compounds.

For example, when the entire main container 141 includes SiC polycrystals, as in an embodiment of the present invention, the atomic number ratio Si/C in the main container 141 exceeds 1 by installing a Si vapor supply source. Specifically, when the workpiece 1 and the SiC material 4, which satisfy the stoichiometric ratio of 1:1, and the Si vapor supply source are installed in the SiC polycrystalline main body container 141 that satisfies the stoichiometric ratio of 1:1, the atomic number ratio Si/C in the main body container 141 will exceed 1.

The SiC—Si equilibrium vapor pressure environment according to an embodiment of the present invention is formed by heating a semi-closed space having an atomic number ratio Si/C of more than 1. The SiC—C equilibrium vapor pressure environment according to an embodiment of the present invention is formed by heating a semi-closed space having an atomic number ratio Si/C of 1 or less. The main container 141 according to an embodiment of the present invention may be configured to house predetermined members as appropriate so as to achieve a SiC—Si equilibrium vapor pressure environment or SiC—C equilibrium vapor pressure environment.

The heating furnace 143 is configured to heat the main container 141 to form a temperature gradient so that the temperature drops/rises from the upper container 141c to the lower container 141b. This creates a temperature gradient in the direction of the thickness of the workpiece 1.

As illustrated in FIG. 12, the heating furnace 143 includes a main heating chamber 143c capable of heating the workpiece 1 or the like to a temperature of 1000° C. to 2300° C., a preliminary chamber 143a capable of preheating the object to be treated to a temperature of 500° C. or higher, a refractory container 142 capable of housing the main container 141, and a moving means 143b (moving table) capable of moving the refractory container 142 from the preliminary chamber 143a to the main heating chamber 143c.

The main heating chamber 143c is regular hexagonal in planar cross-sectional view, and the refractory container 142 is installed inside it. The main heating chamber 143c includes heaters 143d (mesh heaters). Multilayer heat-reflective metal plates are fixed to the side walls and ceiling of the main heating chamber 143c (not illustrated). The multilayer heat-reflective metal plates are configured to reflect the heat of the heaters 143d toward the substantially central portion of the main heating chamber 143c.

The heaters 143d are installed in the main heating chamber 143c to surround the refractory container 142 in which the object to be treated is contained. At this time, the multilayer heat-reflective metal plates are installed on the outside of the heaters 143d, which enables temperature increase in the temperature range of 1000° C. to 2300° C.

The heaters 143d may be, for example, of resistance heating type or high-frequency induction heating type.

The heaters 143d may be configured to be able to form a temperature gradient in the refractory container 142. For example, the heaters 143d may be configured so that more heaters are installed on the upper (or lower) side. The heaters 143d may be configured so that the width increases toward the upper (or lower) side. Alternatively, the heaters 143d may be configured to be able to increase the power supplied toward the upper (or lower) side.

The main heating chamber 143c is connected to a vacuum formation valve 143f for evacuating air from the main heating chamber 143c, an inert gas injection valve 143e for introducing an inert gas into the main heating chamber 143c, and a vacuum gauge 143g for measuring the degree of vacuum in the main heating chamber 143c.

The vacuum formation valve 143f is connected to a vacuum pump (not illustrated) that evacuates air and vacuates the main heating chamber 143c. By using the vacuum formation valve 143f and the vacuum pump, the degree of vacuum in the main heating chamber 143c can be adjusted preferably to 10 Pa or less, more preferably to 1.0 Pa or less, and most preferably to $10^{-3}$ Pa or less. Examples of the vacuum pump include a turbo molecular pump.

The inert gas injection valve 143e is connected to an inert gas supply source (not illustrated).

This inert gas injection valve 143e and the inert gas supply source allow inert gas to be introduced into the main heating chamber 143c in the range of $10^{-5}$ to $10^4$ Pa. The inert gas may be, for example, Ar.

The inert gas injection valve 143e is a dopant gas supply means capable of supplying a dopant gas into the main container 141. That is, by selecting a dopant gas (for example, $N_2$) as the inert gas, the dopant concentration in the growth layer 10 can be increased.

The preliminary chamber 143a is connected to the main heating chamber 143c, and is configured to allow the refractory container 142 to be moved thereinto by the moving means 143b. The preliminary chamber 143a of the present embodiment is configured to be heated by the residual heat of the heaters 143d of the main heating chamber 143c. For example, when the main heating chamber 143c is heated to 2000° C., the preliminary chamber 143a is heated to about 1000° C., which allows the degassing treatment of the object to be treated (for example, the workpiece 1, the main container 141, or the refractory container 142).

The moving means 143b is configured to move between the main heating chamber 143c and the preliminary chamber 143a with the refractory container 142 on top of it.

The transfer between the main heating chamber 143c and the preliminary chamber 143a by the moving means 143b can be completed in as little as one minute, so that temperature rise and fall at from 1.0 to 1000° C./min can be achieved. This allows for rapid temperature rise and fall, which makes it possible to observe the surface profile without low temperature growth history during temperature rise and fall.

In FIG. 12, the preliminary chamber 143a is installed below the main heating chamber 143c, but the preliminary chamber 143a may be installed in any other direction.

The moving means 143b according to the present embodiment is a moving table on which the refractory container 142 is placed. The contact area between the moving table and the refractory container 142 becomes the path for heat propagation. This makes it possible to form a temperature gradient in the refractory container 142 so that the contact area between the moving table and the refractory container 142 is on the low temperature side.

In the heating furnace 143 of the present embodiment, since the bottom of the refractory container 142 is in contact with the moving table, a temperature gradient is provided so that the temperature decreases from the upper container 142*b* to the lower container 142*a* of the refractory container 142.

The direction of the temperature gradient can be set in any direction by changing the position of the contact area between the moving table and the refractory container 142. For example, when a suspended type or the like is used for the moving table and the contact area is set on the ceiling of the refractory container 142, heat escapes in the upward direction. Therefore, a temperature gradient is provided so that the temperature increases from the upper container 142*b* to the lower container 142*a* of the refractory container 142. This temperature gradient is preferably formed along the thickness direction of the workpiece 1 and the SiC material 4. The temperature gradient may be formed by the configuration of the heaters 143*d* as described above.

The vapor pressure environment of the gas-phase species containing Si elements in the heating furnace 143 according to the present embodiment is formed using the refractory container 142 and a Si vapor supply material. For example, any method that can form an environment of vapor pressure of a vapor phase species containing Si elements around the main container 141 may be used in an embodiment of the present invention.

The refractory container 142 preferably includes a high-melting point material having a melting point equal to or higher than the melting point of the material constituting the main container 141.

Examples of the refractory container 142 include C which is a general-purpose heat-resistant material, W, Re, Os, Ta, and Mo which are high-melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, and $TiB_2$ which are borides, and SiC polycrystals.

As illustrated in FIG. 12, the refractory container 142, like the main container 141, is a fitting container including the upper container 142*b* and the lower container 142*a* that can be fitted to each other, and is configured to house the main container 141. A minute gap 43 is formed at the fitting portion between the upper container 142*b* and the lower container 142*a*, through which the inside of the refractory container 142 can be evacuated (vacuated).

The refractory container 142 has a Si vapor supply material that can supply vapor pressure of gas-phase species containing Si elements in the refractory container 142.

The Si vapor supply material should be configured to generate Si vapor in the refractory container 142 during the heat treatment, and examples thereof include solid Si (Si pellets such as Si pieces and Si powder) and Si compounds.

The Si vapor supply material is, for example, a thin film that coats the inner wall of the refractory container 142.

When the refractory container 142 is a metal compound such as TaC, the Si vapor supply material is, for example, a silicide material of the metal and Si atoms constituting refractory container 142.

The refractory container 142 can maintain the vapor pressure environment of the gas-phase species containing Si elements in the main container 141 by having a Si vapor supply material inside it. It can be understood that this is because the vapor pressure of the gas phase type containing Si elements in the main container 141 and the vapor pressure of the gas phase type containing Si elements outside the main container 141 are balanced.

The present description describes the effects of the present invention with reference to Reference Examples 1 to 3.

Reference Example 1

Under the following conditions, the SiC single crystal substrate E10 is housed in the main container 141, and the main body container 141 is housed in the refractory container 142.

<SiC Single Crystal Substrate E10>
   Polymorphism: 4H—SiC
   Substrate size: horizontal width (10 mm), vertical width (10 mm), thickness (0.3 mm)
   Off-direction and off-angle: 4° off in <11−20> direction
   Growth surface: (0001) plane
   Presence or absence of MSB: absent
   Separation layer or strain layer: absent
Material: SiC Polycrystals
   Container size: diameter (60 mm), height (4.0 mm)
   Distance between SiC single crystal substrate E10 and SiC material: 2.0 mm
   Atomic number ratio Si/C in the container: 1 or less
Material: TaC
   Container size: diameter (160 mm), height (60 mm)
   Si vapor supply material (Si compound): $TaSi_2$ The SiC single crystal substrate E10 installed under the above conditions is heat-treated under the following conditions.
   Heating temperature: 1700° C.
   Heating time: 300 min
   Temperature gradient: 1.0° C./mm
   Growth rate: 5.0 nm/min
   Degree of vacuum of main heating chamber 143*c*: $10^{-5}$ Pa FIG. 13 illustrates the method for determining the conversion rate from BPDs to other defects and dislocations (for example, TED) in the growth layer E11.

FIG. 13(*a*) illustrates the growth layer E11 grown by the heating step. During this heating step, the BPDs present on the SiC single crystal substrate E10 are converted to TEDs with a certain probability. Therefore, TEDs and BPDs are mixed on the surface of the growth layer E11, unless the BPDs are 100% converted.

FIG. 13(*b*) illustrates the confirmation of defects in the growth layer E11 using the KOH dissolution etching method. In the KOH dissolution etching method, the SiC single crystal substrate E10 is immersed in a dissolved salt (for example, KOH) that has been heated to about 500° C., etch pits are formed in the dislocation or defect region, and the type of dislocation is determined by the size and shape of the etch pits. By this method, the number of BPDs present on the surface of the growth layer E11 is evaluated.

FIG. 13(*c*) illustrates the removal of the growth layer E11 after KOH dissolution etching. In this method, after planarization by mechanical polishing or CMP to the depth of the etch pit, the growth layer E11 is removed by thermal etching to reveal the surface of the SiC single crystal substrate E10.

FIG. 13(*d*) illustrates the confirmation of defects in the SiC single crystal substrate E10 after removal of the growth layer E11 using the KOH dissolution etching method. By this method, the number of BPDs present on the surface of SiC single crystal substrate E10 is evaluated.

By comparing the number of BPDs in the surface of the growth layer E11 (see FIG. 13(*b*)) with the number of BPDs in the surface of the SiC single crystal substrate E10 (see FIG. 13(*d*)), according to the sequence in FIG. 13, the BPD conversion rate, which is the conversion of BPDs to other defects and dislocations by heat treatment, can be obtained.

The number of BPDs on the surface of the growth layer E11 in Reference Example 1 was about 0/cm², and the number of BPDs on the surface of the SiC single crystal substrate E10 was 1000/cm². Therefore, it can be understood that BPDs are reduced and removed by placing and heating the SiC single crystal substrate E10 without MSBs on the surface in a semi-closed space having an atomic number ratio Si/C of 1 or less.

In Reference Example 1, since the SiC—C equilibrium vapor pressure environment is formed in the main container 141 so that the atomic number ratio Si/C in the main container 141 is 1 or less, it can be understood that BPDs can be reduced and removed in the growth step S1.

Reference Example 2

Under the following conditions, the SiC single crystal substrate E10 was housed in the main container 141, and the main container 141 was further housed in the refractory container 142.

<SiC single crystal substrate E10>
Polymorphism: 4H—SiC
Substrate size: horizontal width (10 mm), vertical width (10 mm), thickness (0.3 mm)
Off-direction and off-angle: 4° off in <11–20> direction
Growth surface: (0001) plane
Presence or absence of MSB: present
Material: SiC Polycrystals
Container size: diameter (60 mm), height (4.0 mm)
Distance between SiC single crystal substrate E10 and SiC material: 2.0 mm
Si vapor supply source: Si piece
Atomic number ratio Si/C in the container: more than 1
By housing Si pieces along with a SiC single crystal substrate in the main body container 141, the atomic number ratio Si/C in the container exceeds 1.
Material: TaC
Container size: 160 mm (diameter)×60 mm (height)
Si vapor supply material (Si compound): TaSi₂
The SiC single crystal substrate E10 installed under the above conditions is heat-treated under the following conditions.
Heating temperature: 1800° C.
Heating time: 60 min
Temperature gradient: 1.0° C./mm
Growth rate: 68 nm/min
Degree of vacuum of main heating chamber 143c: 10⁻⁵ Pa FIG. 14 is an SEM image of the surface of SiC single crystal substrate E10 before the growth of growth layer E11. FIG. 14(a) is a SEM image observed at a magnification of ×1000, and FIG. 14(b) is a SEM image observed at a magnification of ×100000. The MSBs are formed on the surface of SiC single crystal substrate E10 before the growth of the growth layer E11, and it can be understood that the steps having a height of 3.0 nm or more are arranged with an average terrace width of 42 nm. The step height was measured by AFM.

FIG. 15 is an SEM image of the surface of the SiC single crystal substrate E10 after the growth of the growth layer E11. FIG. 15(a) is a SEM image observed at magnification ×1000, and FIG. 15(b) is a SEM image observed at magnification ×100000.

No MSBs are formed on the surface of the growth layer E11 of Reference Example 2, and it can be understood that the steps having a height of 1.0 nm (full unit cell) are regularly arranged with a terrace width of 14 nm. The step height was measured by AFM.

Therefore, it can be understood that the SiC single crystal substrate E10 having MSBs on the surface is placed in a semi-closed space having an atomic number ratio Si/C of more than 1, and heated to form the growth layer E11 in which the MSBs are decomposed.

In Reference Example 2, he Si vapor supply source is installed so that the atomic number ratio Si/C in the main container 141 exceeds 1, so that a SiC—Si equilibrium vapor pressure environment is formed in the main container 141. Therefore, it can be understood that MSBs on the SiC single crystal substrate surface can be decomposed during the growth step S1.

Reference Example 3

FIG. 16 is a graph of the relationship between the heating temperature and the growth rate in the method for producing a SiC single crystal substrate according to the present invention. The horizontal axis of this graph is the reciprocal of the temperature, and the vertical axis of this graph is the logarithmic growth rate. The results of growing the growth layer E11 on the SiC single crystal substrate E10 by placing the SiC single crystal substrate E10 in a space (in the main container 141) having an atomic number ratio Si/C of more than 1 are marked with ○. The results of growing the growth layer E11 on the SiC single crystal substrate E10 by placing it in a space (in the main body container 141) having an atomic number ratio Si/C of 1 or less are marked with x.

In the graph in FIG. 16, the results of thermodynamic calculations for SiC substrate growth in a SiC—Si equilibrium vapor pressure environment are depicted as dashed lines (Arrhenius plot), and the results of thermodynamic calculations for SiC substrate growth in a SiC—C equilibrium vapor pressure environment are depicted as double-dotted lines (Arrhenius plot).

In the present method, the SiC single crystal substrate E10 is grown by using the chemical potential difference and temperature gradient as growth driving force under the condition that the vapor pressure environment between the SiC material and the SiC substrate becomes the SiC—C equilibrium vapor pressure environment or SiC—C equilibrium vapor pressure environment. An example of this chemical potential difference is the partial pressure difference of gas phase species generated at the surface of SiC polycrystals and SiC single crystals.

When the partial pressure difference of the vapor generated from the SiC material (source) and the SiC substrate (transport destination) is considered as the growth amount, the SiC growth rate can be obtained by the following equation 1:

$$\text{Growth rate} \propto \sum_{i=SiC, Si_2C, SiC_2} \frac{(P_{transport\,souce\,i} - P_{transport\,destination\,i})}{\sqrt{2\pi m_i kT}} \qquad \text{[Equation 1]}$$

where T is the temperature of the SiC material side, $m_i$ is the molecular weight of the gas phase species ($Si_xC_y$), and k is the Boltzmann constant. The $P_{transport\,source\,i} - P_{transport\,destination\,i}$ is the growth amount where the raw material gas becomes supersaturated and precipitated as SiC, and SiC, $Si_xC$, and $SiC_2$ are assumed as raw material gases.

Therefore, the dashed line is the result of thermodynamic calculation when SiC single crystals are grown from SiC polycrystals in the vapor pressure environment when SiC (solid) and Si (liquid phase) are in phase equilibrium through a vapor phase. The results were obtained by thermodynamic calculations using the equation 1 under the following conditions (i) to (iv).

(i) The volume of the SiC—Si equilibrium vapor pressure environment is constant.

(ii) The growth driving force is the temperature gradient in the main container 141 and the vapor pressure difference (chemical potential difference) between the SiC polycrystals and SiC single crystals.

(iii) The raw material gases are SiC, $Si_2C$, and $SiC_2$.

(iv) The adsorption coefficient of the raw material on the steps of SiC single crystal substrate E10 is 0.001.

The double-dotted line is the result of thermodynamic calculation when SiC single crystals are grown from SiC polycrystals in the vapor pressure environment when SiC (solid phase) and C (solid phase) are in phase equilibrium through a vapor phase. The results were obtained by thermodynamic calculations using the equation 1 under the following conditions (i) to (iv).

(i) The volume of the SiC—C equilibrium vapor pressure environment is constant.

(ii) The growth driving force is the temperature gradient in the main container 141 and the vapor pressure difference (chemical potential difference) between the SiC polycrystals and SiC single crystals.

(iii) The raw material gases are SiC, $Si_2C$, and $SiC_2$.

(iv) The adsorption coefficient of the raw material on the steps of SiC single crystal substrate E10 is 0.001.

The data for each chemical species used in the thermodynamic calculations were used from JANAF thermochemical tables.

According to the graphs in FIG. 16, it can be understood that the trend of the results of growing the growth layer E11 on the SiC single crystal substrate E10 in the space having an atomic number ratio Si/C of more than 1 (in the main container 141) (marked with ○) is consistent with the trend of the results of the thermodynamic calculations of SiC growth in a SiC—Si equilibrium vapor pressure environment. It can be understood that the trend of the results of growing the growth layer E11 on the SiC single crystal substrate E10 in the space (in the main body container 141) having an atomic number ratio Si/C of 1 or less (marked with x) is consistent with the trend of the results of thermodynamic calculations of SiC growth in the SiC—C equilibrium vapor pressure environment.

In a SiC—Si equilibrium vapor pressure environment, it can be understood that a growth rate of 1.0 μm/min or more is achieved at a heating temperature of 1960° C. It can also be understood that a growth rate of more than 2.0 μm/min is achieved at a heating temperature of 2000° C. or higher. On the other hand, in the SiC—C equilibrium vapor pressure environment, it can be understood that a growth rate of 1.0 μm/min or more is achieved at a heating temperature of 2000° C. It can also be understood that a growth rate of 2.0 μm/min or more is achieved at a heating temperature of 2030° C. or higher.

According to the present invention, the combination of growth step S1, the device formation step S2, and the separation step S3 can provide a high quality SiC semiconductor device.

REFERENCE SIGNS LIST

1 Workpiece
1a Back surface
4 SiC material

4a Main surface
10 Growth layer
11 Original substrate
12 SiC semiconductor device formed on the growth layer 10
23 Insulating film
43 Gap
101a Step
101b Terrace
102a Step
102b Terrace
103a Step
103b Terrace
111 Substrate
141 Main container
141a Installation tool
141b Lower container
141c Upper container
142 Refractory container
142a Lower container
142b Upper container
143 Heating furnace
143a Preliminary chamber
143b Moving means
143c Main heating chamber
143d Heater
143e Inert gas injection valve
143f Vacuum formation valve
143g Vacuum gauge
211 Circuit pattern
220 Drift region
221 Well region
222 Contact region
226 Low concentration region
230 Insulating film
240 Gate electrode
241 Source electrode
242 Drain electrode
244 Anode electrode
245 Cathode electrode
300 Separation layer
301 Crystal dislocation
302 Damaged region
311 Light source
312 Light collecting means
E10 SiC single crystal substrate
E11 Growth layer
S1 Growth step
S11 Epitaxial growth step
S12 Bunching decomposition step
S2 Device formation step
S21 Patterning step
S22 Doping step
S23 Insulating film formation step
S24 Electrode formation step
S3 Separation step
S31 Separation layer formation step
S32 Peeling step
S4 Etching step
W1 Terrace length
W2 Terrace length
W3 Terrace length

The invention claimed is:

1. A method for producing a SiC semiconductor device, comprising:

a growth step of forming a growth layer on a workpiece comprising SiC single crystals based on physical vapor transport, a device formation step of forming at least a portion of a SiC semiconductor device in the growth layer, and a separation step of separating at least a portion of the SiC semiconductor device from the workpiece, wherein the growth step-comprises:

performing a step of forming a first growth layer on the workpiece under a SiC—C equilibrium vapor pressure environment, followed by performing a step of forming a second growth layer on the workpiece under a SiC—Si equilibrium vapor pressure environment, wherein, in the growth step, the workpiece is housed in a SiC polycrystalline main container, in the step of forming the first growth layer, the SiC—C equilibrium vapor pressure environment is formed inside the main container by heating the main container, and in the step of forming the second growth layer, the SiC—Si equilibrium vapor pressure environment is formed inside the main container by installing a solid Si or a Si compound serving as a Si vapor supply source in the main container and heating the main container.

2. The producing method according to claim 1, wherein the growth step comprises heat-treating the workpiece in an atmosphere containing Si and C elements.

3. The producing method according to claim 2, wherein the growth step comprises heat-treating the workpiece in a semi-closed space where a SiC material is exposed.

4. The producing method according to claim 1, wherein the device formation step comprises a patterning step of forming a circuit pattern on the growth layer.

5. The producing method according to claim 1, wherein the device formation step comprises a doping step of introducing dopant atoms into the growth layer.

6. The producing method according to claim 1, wherein the device formation step comprises an insulating film formation step of introducing an insulating film into the growth layer.

7. The producing method according to claim 1, wherein the device formation step comprises an electrode formation step of forming an electrode on the growth layer.

8. The producing method according to claim 1, wherein the separation step includes a separation layer formation step of forming a separation layer inside the workpiece including the growth layer, and a peeling step of peeling off a portion of the workpiece including the growth layer starting from the separation layer.

9. The producing method according to claim 8, wherein the separation layer formation step comprises forming the separation layer by irradiating laser onto the workpiece so that the inside is the focal point.

10. The producing method according to claim 1, comprising an etching step of etching the workpiece by heat-treating the workpiece in an atmosphere containing Si and C elements.

11. The producing method according to claim 10, wherein the etching step comprises heat-treating the workpiece in a semi-closed space where a SiC material is exposed.

12. The producing method according to claim 10, wherein the producing method comprises the separation step, the etching step, and the growth step in this order.

13. The producing method according to claim 1, wherein the producing method comprises the separation step and the growth step in this order.

14. The method for producing a SiC semiconductor device according to claim 1, wherein in the step of forming the first growth layer, the SiC—C equilibrium vapor pressure environment is formed by heat-treating a semi-closed space having an atomic ratio Si/C of 1 or less, and in the step of forming the second growth layer, the SiC—Si equilibrium vapor pressure environment is formed by heat-treating a semi-closed space having an atomic ratio Si/C of more than 1.

* * * * *